(12) United States Patent
Pan et al.

(10) Patent No.: US 11,996,332 B2
(45) Date of Patent: May 28, 2024

(54) SEMICONDUCTOR DEVICE AND METHOD OF MANUFACTURING THE SAME

(71) Applicant: Taiwan Semiconductor Manufacturing Company, Ltd., Hsinchu (TW)

(72) Inventors: Kuan-Ting Pan, Taipei (TW); Chih-Hao Wang, Hsinchu County (TW); Kuo-Cheng Chiang, Hsinchu County (TW); Yi-Bo Liao, Hsinchu (TW); Yi-Ruei Jhan, Keelung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/180,140

(22) Filed: Mar. 8, 2023

(65) Prior Publication Data

US 2023/0223305 A1 Jul. 13, 2023

Related U.S. Application Data

(62) Division of application No. 16/856,033, filed on Apr. 23, 2020, now Pat. No. 11,621,195.

(Continued)

(51) Int. Cl.
*H01L 21/8234* (2006.01)
*H01L 21/762* (2006.01)
*H01L 29/423* (2006.01)

(52) U.S. Cl.
CPC ........ *H01L 21/823418* (2013.01); *H01L 21/76205* (2013.01); *H01L 29/42384* (2013.01)

(58) Field of Classification Search
CPC .......... H01L 29/0673; H01L 29/42392; H01L 29/78696; H01L 27/092; H01L 29/66545; H01L 29/42384; H01L 29/66439; H01L 21/76205; H01L 29/0847; H01L 29/775; H01L 29/165; H01L 21/823418; H01L 21/823807; H01L 29/6656; H01L 29/7848; H01L 21/823814; H01L 29/0653; H01L 29/42356; H01L 29/785; H01L 29/66772; H01L 21/823437; H01L 29/78654; H01L 23/535; H01L 27/088; H01L 29/517; H01L 29/1033; H01L 29/7831; H01L 21/823412;
(Continued)

(56) References Cited

U.S. PATENT DOCUMENTS 9,209,247 B2  12/2015  Colinge et al.
9,236,267 B2  1/2016  De et al.
(Continued)

*Primary Examiner* — Mouloucoulaye Inoussa
(74) *Attorney, Agent, or Firm* — JCIPRNET

(57) ABSTRACT

A semiconductor device includes a semiconductor substrate, a first semiconductor stack, a second semiconductor stack, a first gate structure, and a second gate structure. The semiconductor substrate comprising a first device region and a second device region. The first semiconductor stack is located on the semiconductor substrate over the first device region, and has first channels. The second semiconductor stack is located on the semiconductor substrate over the second device region, and has second channels. A total number of the first channels is greater than a total number of the second channels. The first gate structure encloses the first semiconductor stack. The second gate structure encloses the second semiconductor stack.

20 Claims, 30 Drawing Sheets

Related U.S. Application Data

(60) Provisional application No. 62/928,318, filed on Oct. 30, 2019.

(58) Field of Classification Search
CPC ........... H01L 29/0669; H01L 29/42368; H01L 21/02603; H01L 21/82385; H01L 21/823456; H01L 29/401; H01L 29/42376; H01L 21/823462; H01L 21/845; H01L 21/86; H01L 27/1211; H01L 21/30604; H01L 21/3065; B82Y 10/00; B82Y 40/00
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2017/0250180 A1* | 8/2017 | Lee ..................... H01L 29/6656 |
| 2020/0006333 A1* | 1/2020 | Noh ..................... H01L 29/775 |
| 2020/0066839 A1* | 2/2020 | Zhang ............. H01L 21/823412 |

\* cited by examiner

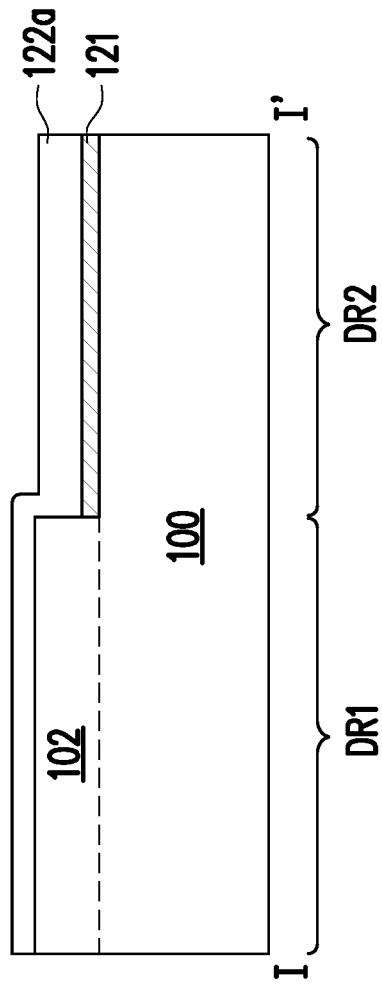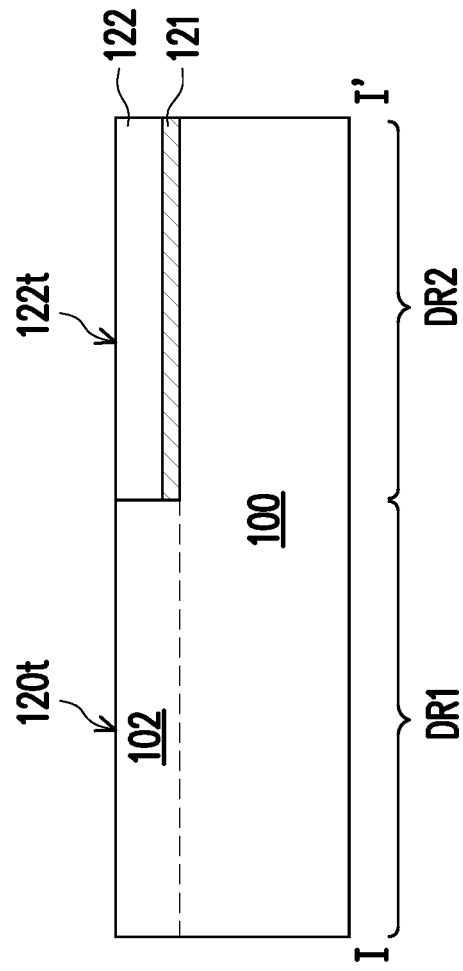
FIG. 3
FIG. 4

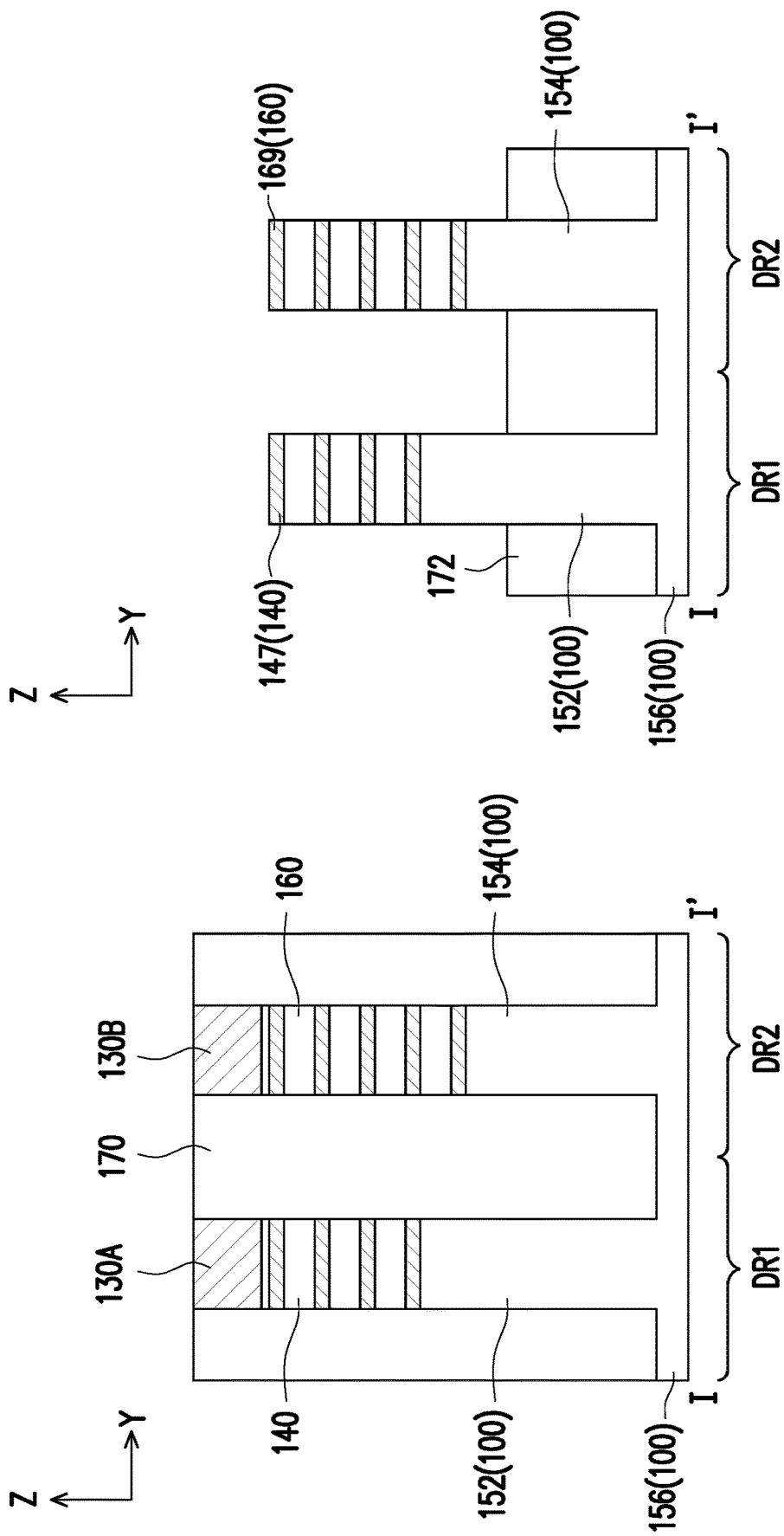

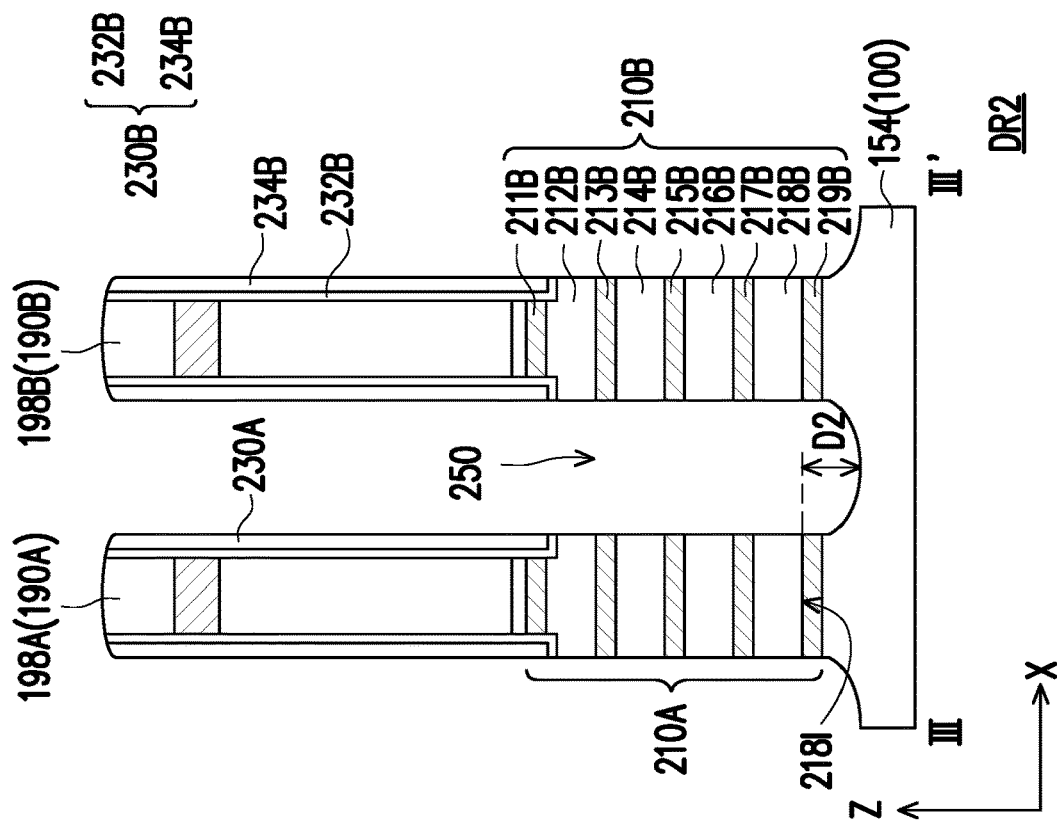
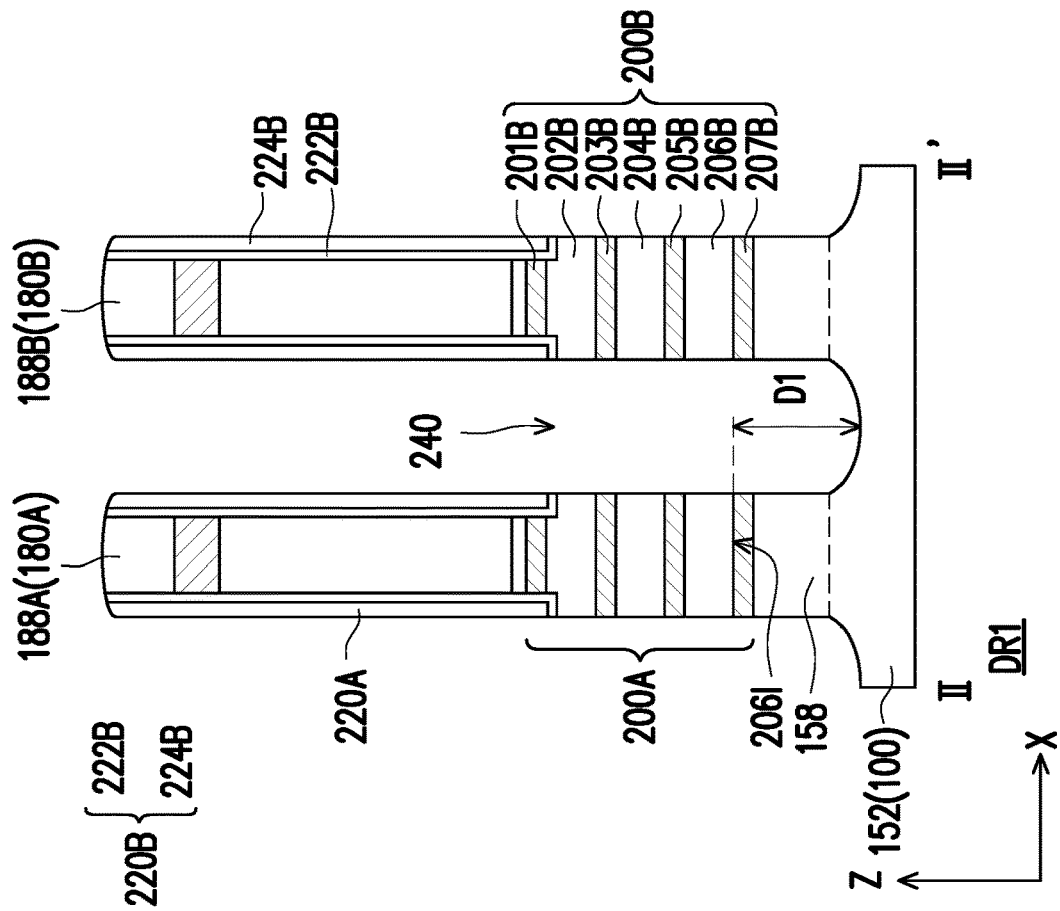
FIG. 10A
FIG. 10B

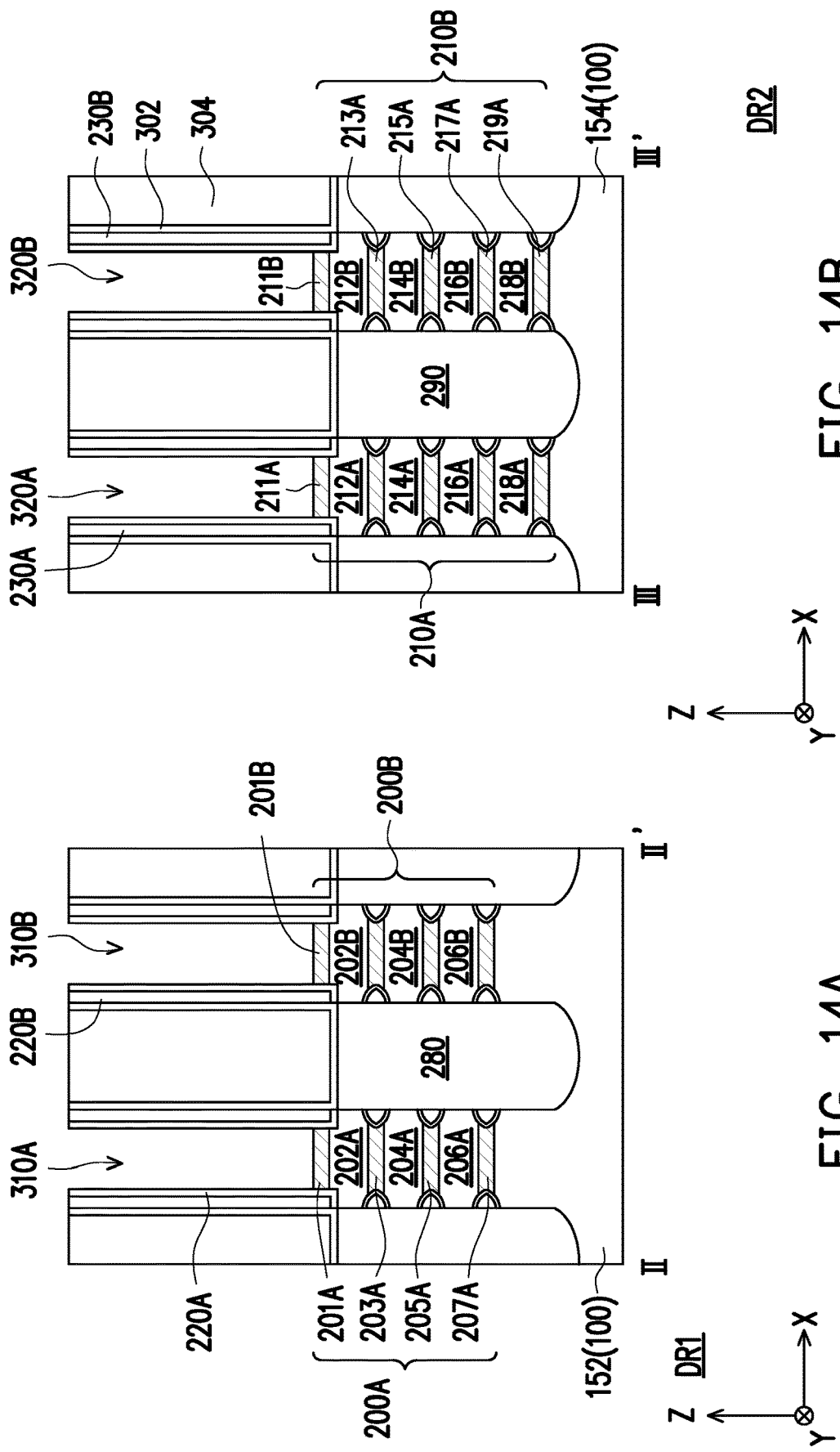

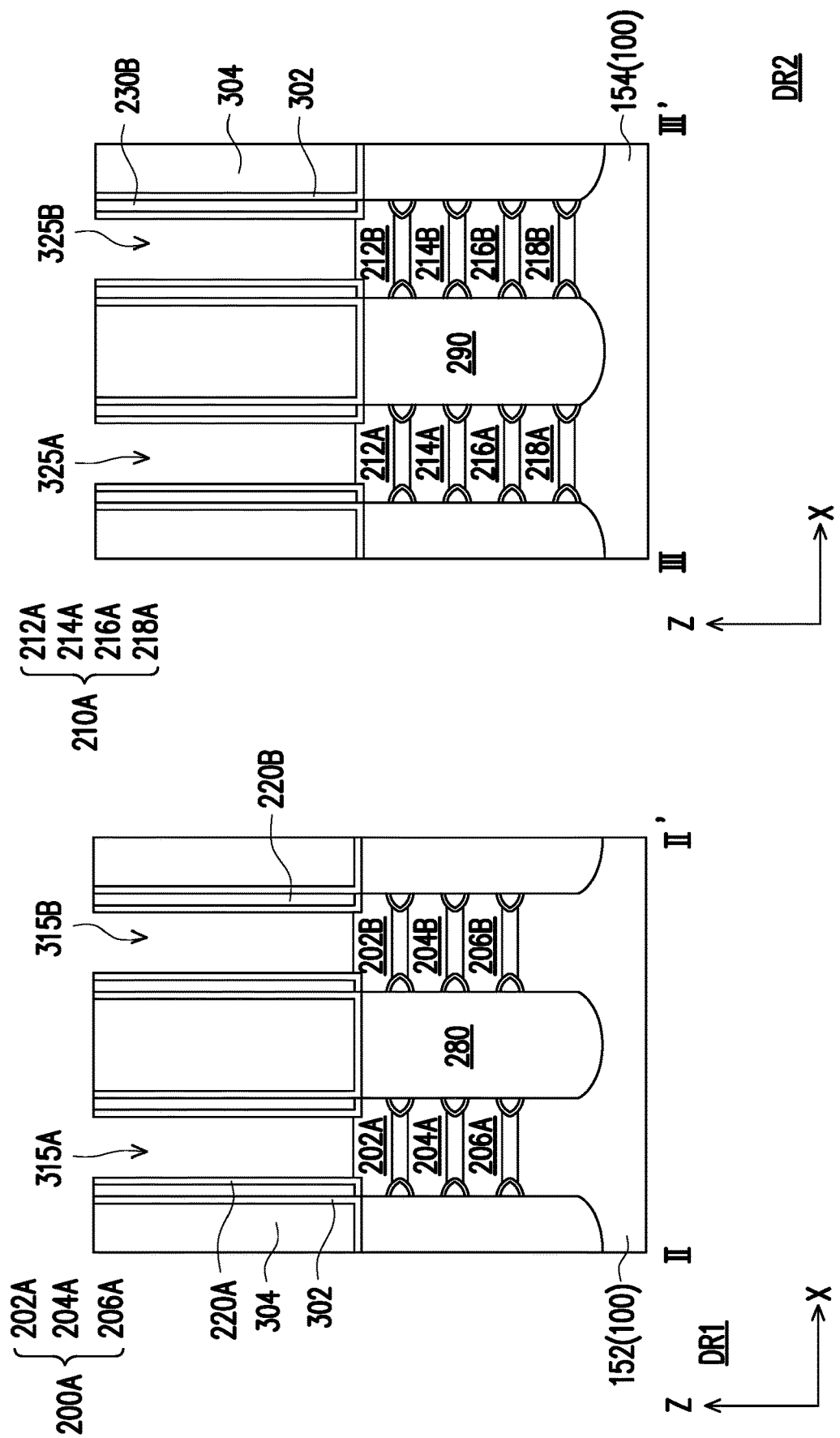

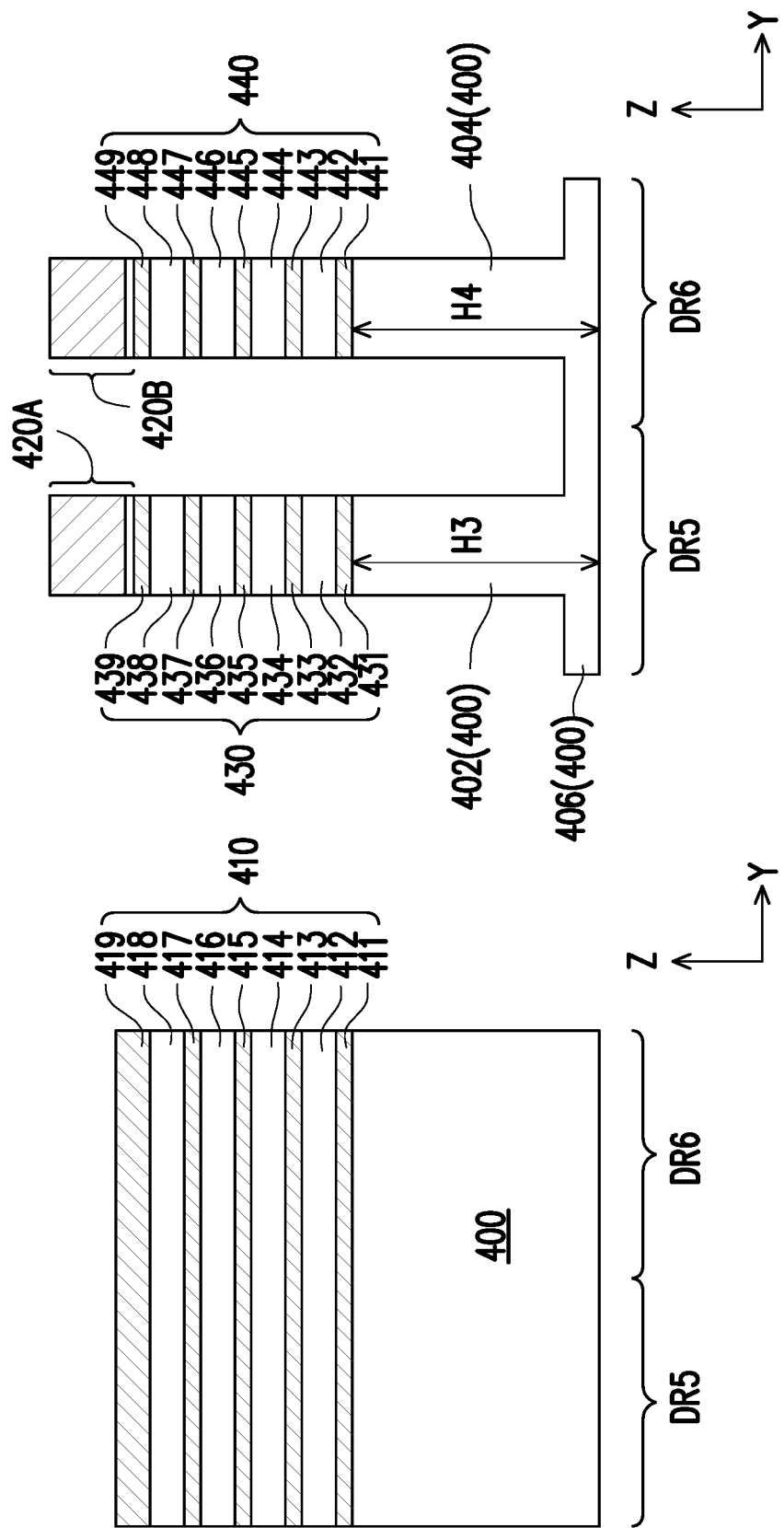

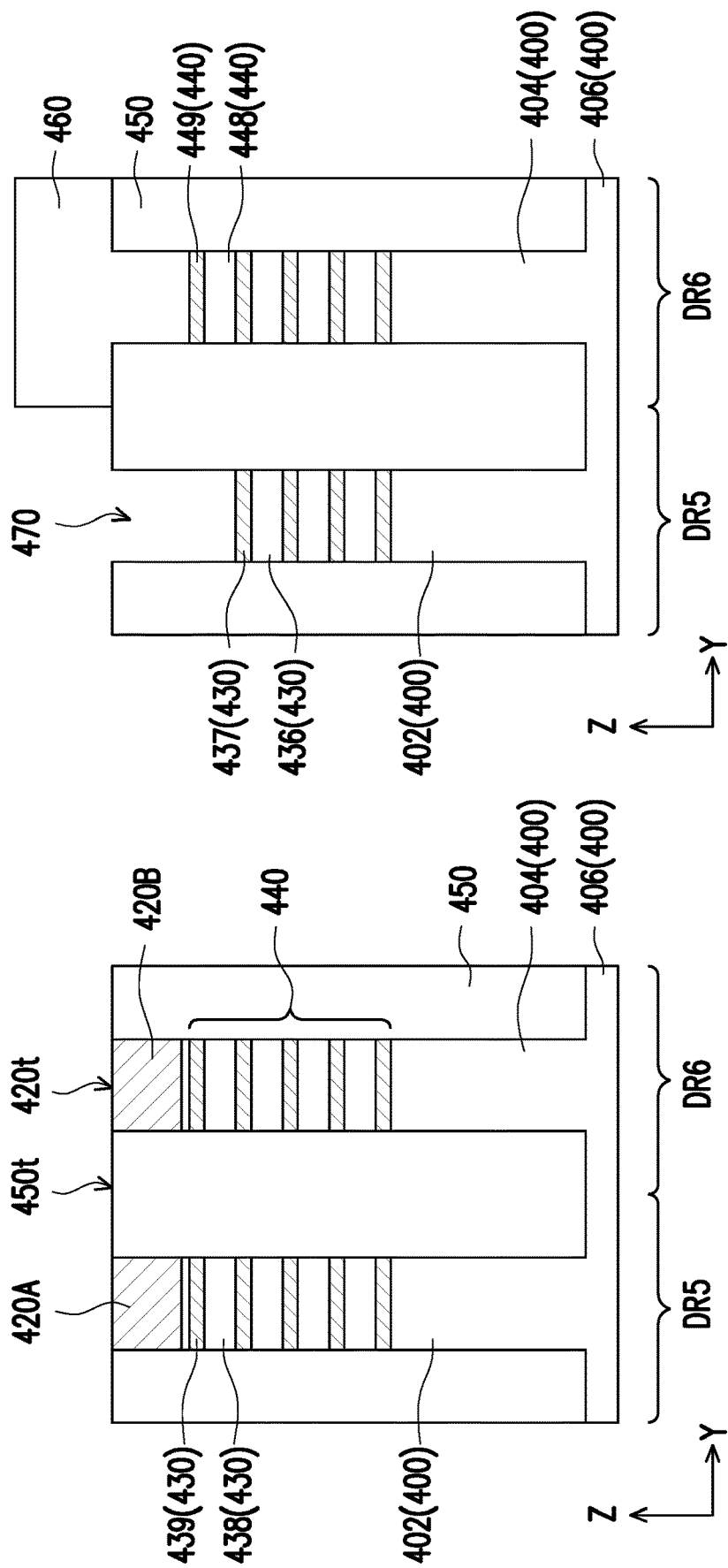

SEMICONDUCTOR DEVICE AND METHOD OF MANUFACTURING THE SAME

CROSS-REFERENCE TO RELATED APPLICATION

This application is a divisional application of and claims the priority benefits of U.S. application Ser. No. 16/856,033, filed on Apr. 23, 2020. The prior application Ser. No. 16/856,033 claims the priority benefit of U.S. provisional application Ser. No. 62/928,318, filed on Oct. 30, 2019. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Challenges from both fabrication and design issues have resulted in the development of three-dimensional designs, such as fin field-effect transistors (FinFETs).

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 8 are schematic cross-sectional views of structures produced during a manufacturing method of a semiconductor device according to some embodiments of the disclosure.

FIG. 9A to FIG. 16A are schematic cross-sectional views of structures produced during a manufacturing method of a semiconductor device according to some embodiments of the disclosure.

FIG. 9B to FIG. 16B are schematic cross-sectional views of different regions of the structures illustrated in FIG. 9A to FIG. 16A.

FIG. 18 to FIG. 22 are schematic cross-sectional view of structures produced during a manufacturing method of a semiconductor device according to some embodiments of the disclosure.

FIG. 23A to FIG. 25A are schematic cross-sectional views of structures produced during a manufacturing method of a semiconductor device according to some embodiments of the disclosure.

FIG. 23B to FIG. 25B are schematic cross-sectional views of different regions of the structures illustrated in FIG. 23A to FIG. 25A.

FIG. 27A to FIG. 30A are schematic cross-sectional views of structures produced during a manufacturing method of a semiconductor device according to some embodiments of the disclosure.

FIG. 27B to FIG. 30B are schematic cross-sectional views of different regions of the structures illustrated in FIG. 27A to FIG. 30A.

DETAILED DESCRIPTION

Figure 1:
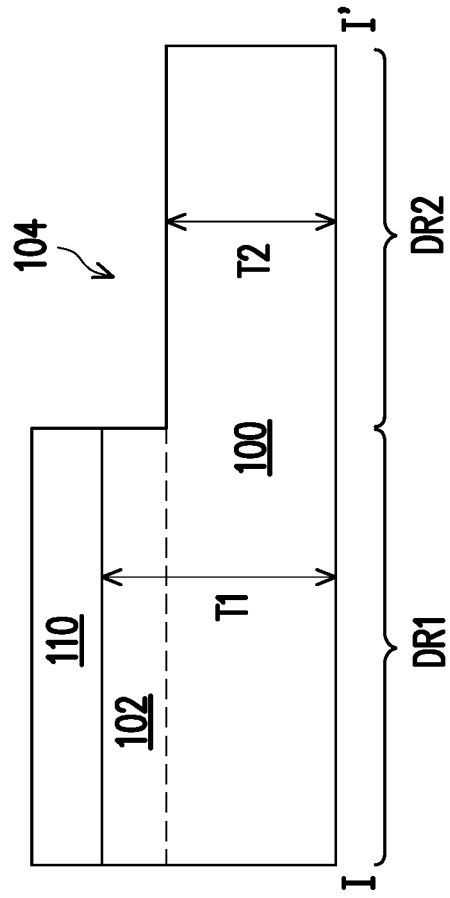

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The embodiments of the disclosure describe the exemplary manufacturing process of semiconductor devices and the semiconductor devices fabricated there-from. In certain embodiments of the disclosure, the semiconductor devices may be formed on bulk silicon substrates. Still, the semiconductor devices may be formed on a silicon-on-insulator (SOI) substrate, a germanium-on-insulator (GOI) substrate, a SiGe substrate, or a Group III-V semiconductor substrate.

Also, in accordance with some embodiments of the disclosure, the silicon substrate may include other conductive layers or other semiconductor elements, such as transistors, diodes or the like. The embodiments are not limited in this context. The semiconductor devices may be included in microprocessors, memories, and/or other integrated circuits (IC). Accordingly, it is understood that additional processes may be provided before, during, and after the illustrated method, and that some other processes may only be briefly described herein. Also, the structures illustrated in the drawings are simplified for a better understanding of the concepts of the present disclosure. For example, although the figures illustrate the structure of a semiconductor device, it is understood the semiconductor device may be part of an IC that further includes a number of other devices such as resistors, capacitors, inductors, fuses, etc.

FIG. 1 to FIG. 8 are schematic cross-sectional views of structures produced during a manufacturing method of a semiconductor device according to some embodiments of the disclosure. Referring to FIG. 1, in some embodiments, a semiconductor substrate 100 is provided. In some embodiments, the semiconductor substrate 100 includes a crystalline silicon substrate or a bulk silicon substrate (e.g., wafer). In some embodiments, the semiconductor substrate 100 may be made of a suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 100 includes a silicon on insulator (SOI) substrate. The semiconductor substrate 100 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FET, or alternatively, configured for a p-type FET. In some embodiments, an n-doped region in which an n-type FET is to be formed is flanked by a p-doped region in which a p-type FET is to be formed.

In some embodiments, the semiconductor substrate 100 includes multiple device regions DR1, DR2. Each device region DR1, DR2 may independently include dopants of different conductivity type (e.g., n-type dopants or p-type dopants). Furthermore, the dopant concentration of each device region DR1, DR2 may independently vary with respect to the other device regions. For example, the semiconductor substrate 100 may include a device region DR1 altogether configured as an n-type region, and a device region DR2 adjacent to the device region DR1 altogether configured as a p-type region. While the process is illustrated here for a semiconductor substrate including two device regions DR1, DR2, the disclosure is not limited by the number of device regions DR1, DR2 included in the semiconductor substrate 100. The cross-sectional views of FIG. 1 to FIG. 8 are taken in a YZ plane defined by the orthogonal directions Y and Z at the level height of the line I-I' along the X direction illustrated in the schematic perspective view of FIG. 9. In the cross-sectional views of FIG. 1 to FIG. 8 are visible portions of both device regions DR1 and DR2.

Referring to FIG. 1, an auxiliary mask 110 is formed on one of the device regions (e.g., on the device region DR1). The auxiliary mask 110 is patterned so as to cover the device region DR1 while leaving exposed the device region DR2. In some embodiments, the auxiliary mask 110 includes a positive or a negative photoresist, and may be fabricated through a sequence of deposition, photolithography, and etching processes. In some embodiments, an upper portion of the semiconductor substrate 100 is removed from the device region DR2 left exposed by the auxiliary mask 110, for example via an etching process. Following the removal of semiconductor material from the device region DR2, the semiconductor substrate 100 may have a total thickness T1 along the Z direction in the device region DR1 greater than a total thickness T2 along the Z direction in the device region DR2. That is, the device region DR1 may include a plateau 102 which is raised (in the Z direction) with respect to the semiconductor substrate 100 in the device region DR2. Alternatively stated, the semiconductor substrate 100 may include a recess 104 in correspondence of the device region DR2.

Figure 2:
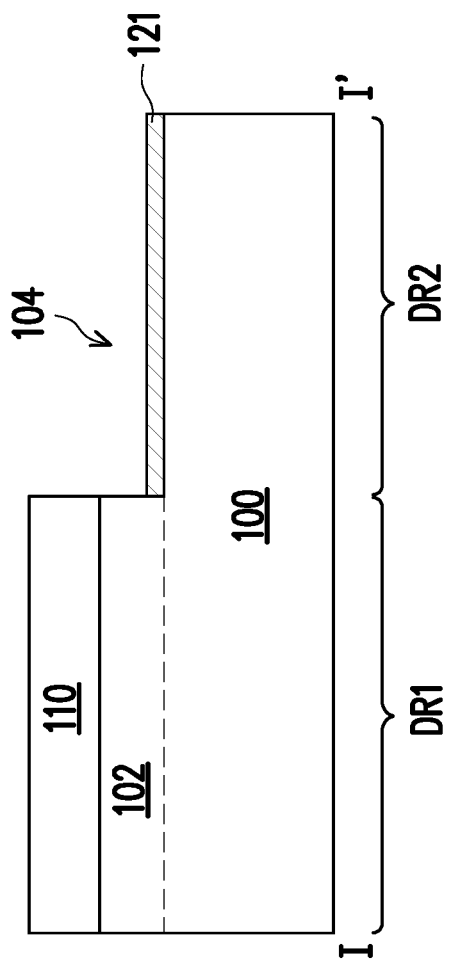

Referring to FIG. 2, a semiconductor layer 121 is formed at the bottom of the recess 104 on the semiconductor substrate 100 on the device region DR2. The semiconductor layer 121 may be blanketly formed on the semiconductor substrate 100 on the device region DR2, for example via epitaxial growth. In some embodiments, the auxiliary mask 110 prevents the growth of the semiconductor layer 121 on the semiconductor substrate 100 on the device region DR1, so that the semiconductor layer 121 is confined on the device regions such as the device region DR2 which are left exposed by the auxiliary mask 110. The semiconductor layer 121 may be made of a semiconductor material different than the semiconductor substrate 100, so that it may be possible to selectively remove the semiconductor layer 121 without substantially removing the semiconductor substrate 100. The selective removal of the semiconductor layer 121 may be performed, for example, via an etching process. For example, the semiconductor substrate 100 may include silicon (Si), and the semiconductor layer 121 may include silicon germanium (SiGe). However, the disclosure is not limited thereto, and other combinations of materials which can be selectively etched are contemplated within the scope of the present disclosure. In some embodiments, the material of the semiconductor layer 121 is referred to as a sacrificial material.

Referring to FIG. 2 and FIG. 3, the auxiliary mask 110 may be removed, for example via an ashing or a stripping process. Thereafter, a blanket semiconductor layer 122a may be formed on the plateau 102 on the device region DR1 and on the semiconductor layer 121 on the device region DR2. The blanket semiconductor layer 122a may include a similar or the same semiconductor material as the semiconductor substrate 100, that is, a material that can withstand the etching conditions in which the sacrificial material of the semiconductor layer 121 is removed. In some embodiments, the material of the blanket semiconductor layer 122a is referred to as a channel material. In some embodiments, the semiconductor layer 122a is epitaxially grown on both device regions DR1 and DR2. As illustrated in FIG. 3, in some embodiments the blanket semiconductor layer 122a may have an uneven profile, extending partially within the recess 104 and partially on the plateau 102. That is, the blanket semiconductor layer 122a may extend at a first level height along the Z direction on the device region DR2 and at a second level height along the Z direction on the device region DR1. Referring to FIG. 3 and FIG. 4, a planarization process may be performed to remove portions of the blanket semiconductor layer 122a. In some embodiments, the planarization process is performed until the plateau 102 is exposed. The remaining part of the blanket semiconductor layer 122a may constitute the semiconductor layer 122, which may be confined on the semiconductor layer 121 on the device region DR2. Following planarization, the top surface 122t of the semiconductor layer 122 on the device region DR2 may be substantially coplanar (located at a same level height along the Z direction) with the top surface 102t of the plateau 102 on the device region DR1. It should be noted that while in the process illustrated here only two semiconductor layers 121, 122 are formed in the recess 104, the disclosure is not limited thereto. In some alternative embodiments, multiple semiconductor layers are formed in the recess 104. In such cases, semiconductor layers of channel material and semiconductor layers of sacrificial materials are formed alternately stacked.

Figure 5:
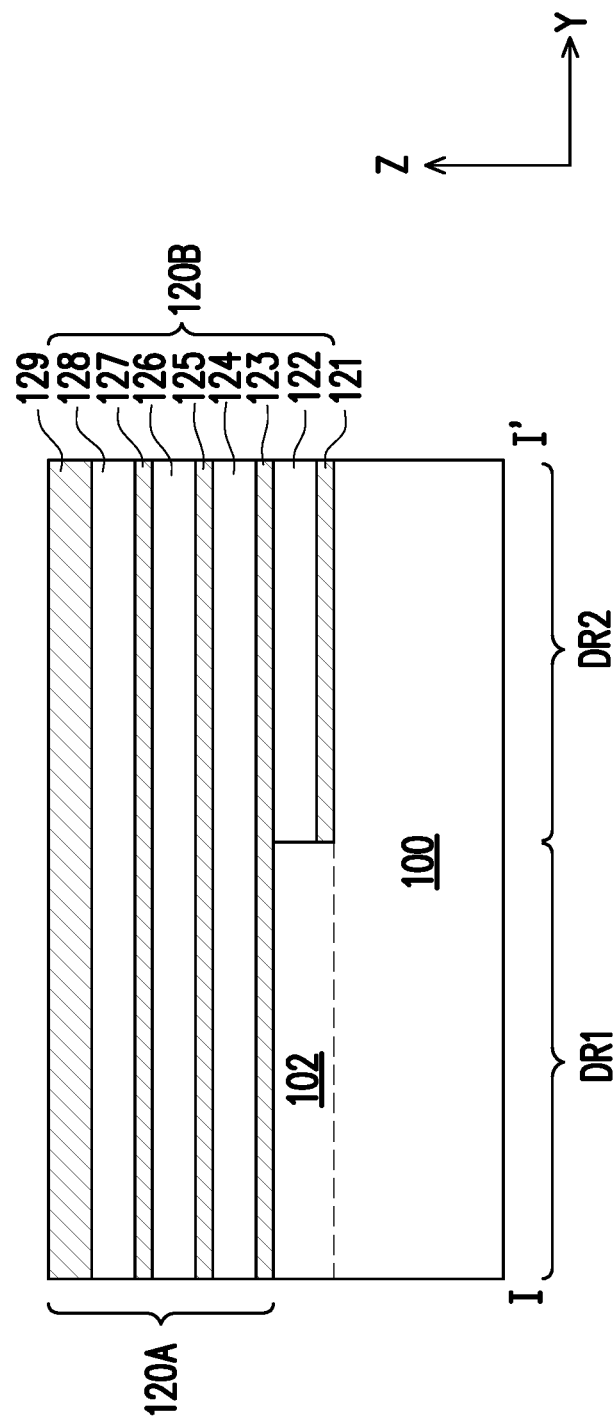

Referring to FIG. 5, semiconductor layers 123-129 are formed over the semiconductor substrate 100 extending over both device regions DR1 and DR2. That is, the semiconductor layers 123-129 may be formed on the plateau 102 on the device region DR1 and on the semiconductor layer 122 on the device region DR2. The semiconductor layers 123-129 alternately include sacrificial material and channel material. For example, the semiconductor layer 123 includes the sacrificial material (as the semiconductor layer 121), the semiconductor layer 124 includes the channel material (as the semiconductor layer 122, and, possibly, the semiconductor substrate 100), and so on. As such, the semiconductor layers 123, 125, 127, 129 include sacrificial material, and the semiconductor layers 124, 126, 128 include channel material. The disclosure is not limited by the number of semiconductor layers 123-129 formed at this stage. In some embodiments, the semiconductor layers 123-129 are epitaxially grown. In some embodiments, the semiconductor layers 121-129 are a semiconductor superlattice. Upon formation of the semiconductor layers 123-129, a stack 120A of semiconductor layers is located on the device region DR1 and another stack 120B of semiconductor layers is located on the device region DR2. The stack 120A includes the portions of semiconductor layers 123-129 located on the plateau 102 on the device region DR1, while the stack 120B includes the semiconductor layers 121, 122 and the portions of semiconductor layers 123-129 located on the semiconductor layer 122 on the device region DR2. That is, the stack 120B may include at least one pair more of semiconductor layers of sacrificial material (e.g., the semiconductor layer 121) and channel material (e.g., the semiconductor layer 122) with respect to the stack 120A. Throughout the disclosure, when multiple elements which are differentiated by a letter in the reference numeral are referred collectively, the letter may be dropped. For example, the two stacks 120A and 120B may be collectively referred to as "stacks 120", if the stack 120A and the stack 120B are not addressed individually. The same applies to other elements of the disclosure.

Figure 6:
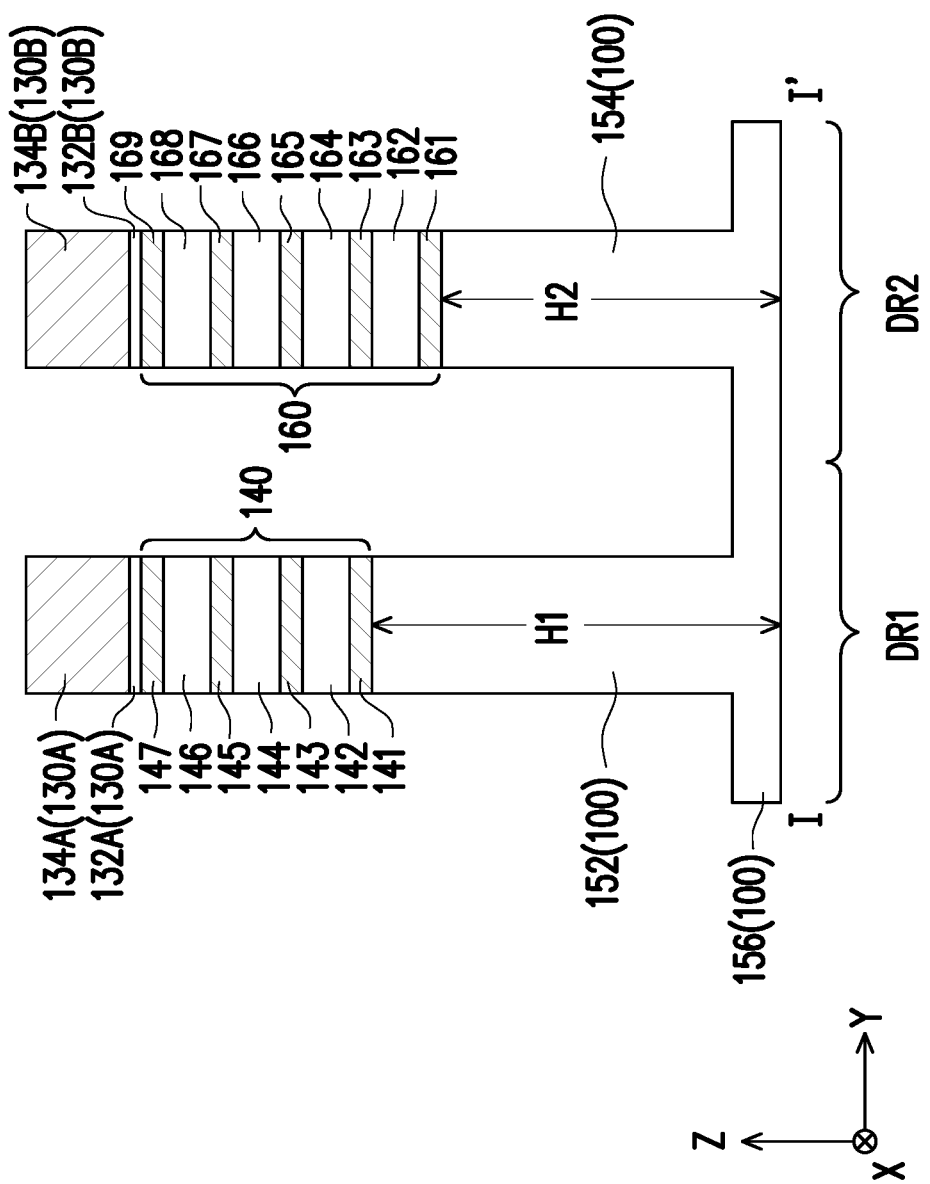

Referring to FIG. 5 and FIG. 6, hard masks 130 are formed on the stacks 120 of semiconductor layers. In some embodiments, the hard mask 130A is formed on the stack 120A on the device region DR1, and the hard mask 130B is formed on the stack 120B on the device region DR2. The hard masks 130 may include stacked dielectric materials. For example, each hard mask 130 may include an etch stop layer 132 and a hard mask dielectric layer 134 disposed on the etch stop layer 132. The hard masks 130 may be formed by patterning a hard mask precursor layer (not shown) which is blanketly formed on the stacks of semiconductor layers 120. The hard mask precursor layer may include a blanket etch stop layer (not shown), and one or more blanket dielectric layers (not shown), which are patterned, for example, via photolithography and etching steps. The hard mask precursor layer may be formed through a sequence of deposition steps, for example including one or more atomic layer deposition steps, chemical vapor deposition steps, or the like. In some embodiments, the hard masks 130 have an elongated shape along the X direction, where the X direction is orthogonal to both the Y and Z directions, so that the X, Y, and Z directions may define a system of orthogonal Cartesian coordinates. In some embodiments, each hard mask 130 has a substantially rectangular footprint in the XY plane. That is, the hard masks 130 may be two or more parallel strips elongated along the X direction. The hard masks 130 are used to pattern the underlying semiconductor layers 121-129 and the semiconductor substrate 100, for example via one or more etching steps. After patterning, a stack 140 of semiconductor strips 141-147 is formed from the semiconductor layers 123-129 of the stack 120A on the device region DR1. The stack 140 may be located on a strip base 152 formed from a portion of the semiconductor substrate 100 in the device region DR1. That is, during the patterning step, portions of the semiconductor layers 123-129 and the semiconductor substrate 100 are removed, to respectively form the strips 141-147 of the stack 140 and the strip base 152. Similarly, on the device region DR2, a stack 160 of semiconductor strips 161-169 is formed from the stack 120B of semiconductor layers 121-129, and a strip base 154 is formed from the semiconductor substrate 100. The strip bases 152 and 154 protrude from a common semiconductor base 156, which is also formed from the semiconductor substrate 100 during the patterning step. The strips 141-147 are respectively located at the same level height (are aligned) along the Z direction as the strips 163-169, as they are formed from the same semiconductor layers 123-129. For example, the strips of sacrificial material 141 and 163 are both formed from the semiconductor layer 123, and, as such, are located at the same level height along the Z direction. The same applies, for example, to the strips of channel material 142 and 164, and so on. However, the stack of semiconductor strips 160 includes at least one strip of channel material 162 and one strip of sacrificial material 161 more than the stack 140, formed from the semiconductor layers 121 and 122 disposed in the recess 104 (illustrated, e.g., in FIG. 1). In some embodiments, the combined height H1 along the Z direction of the strip base 152 and the semiconductor base 156 is greater than the combined height H2 along the Z direction of the strip base 154 and the semiconductor base 156.

Referring to FIG. 7, an insulating material 170 is disposed over the semiconductor substrate 100 on the device regions DR1, DR2, burying the stacks 140, 160 and the strip bases 152, 154. In some embodiments, the insulating material 170 may fill a space in between the strip bases 152 and 154 and in between the stacks 140, 160. In some embodiments, the insulating material 170 may reach the level height of the hard masks 130 along the Z direction. In some embodiments, the insulating material 170 may include silicon oxide, silicon nitride, silicon oxynitride, fluoride-doped silicate glass (FSG), a spin-on dielectric material, a low-k dielectric material, other suitable dielectric materials, or a combination thereof. In some embodiments, the insulating material 170 may include oxides, such as silicon dioxide. In some embodiments, the insulating material 170 may be formed via suitable deposition process, such as, for example, high-density-plasma chemical vapor deposition (HDP-CVD), sub-atmospheric CVD (SACVD), or spin-on. Referring to FIG. 7 and FIG. 8, the insulating material 170 may be recessed to form isolation structures 172 which reach a level height along the Z direction such that the stacks 140 and 160 are exposed. In some embodiments, upper parts of the strip bases 152, 154 are also exposed by the isolation structures 172. In some embodiments, the isolation structures 172 are shallow trench isolation structures (STI). Furthermore, the hard masks 130 may also be removed from the top of the stacks 140 and 160.

Figure 9:
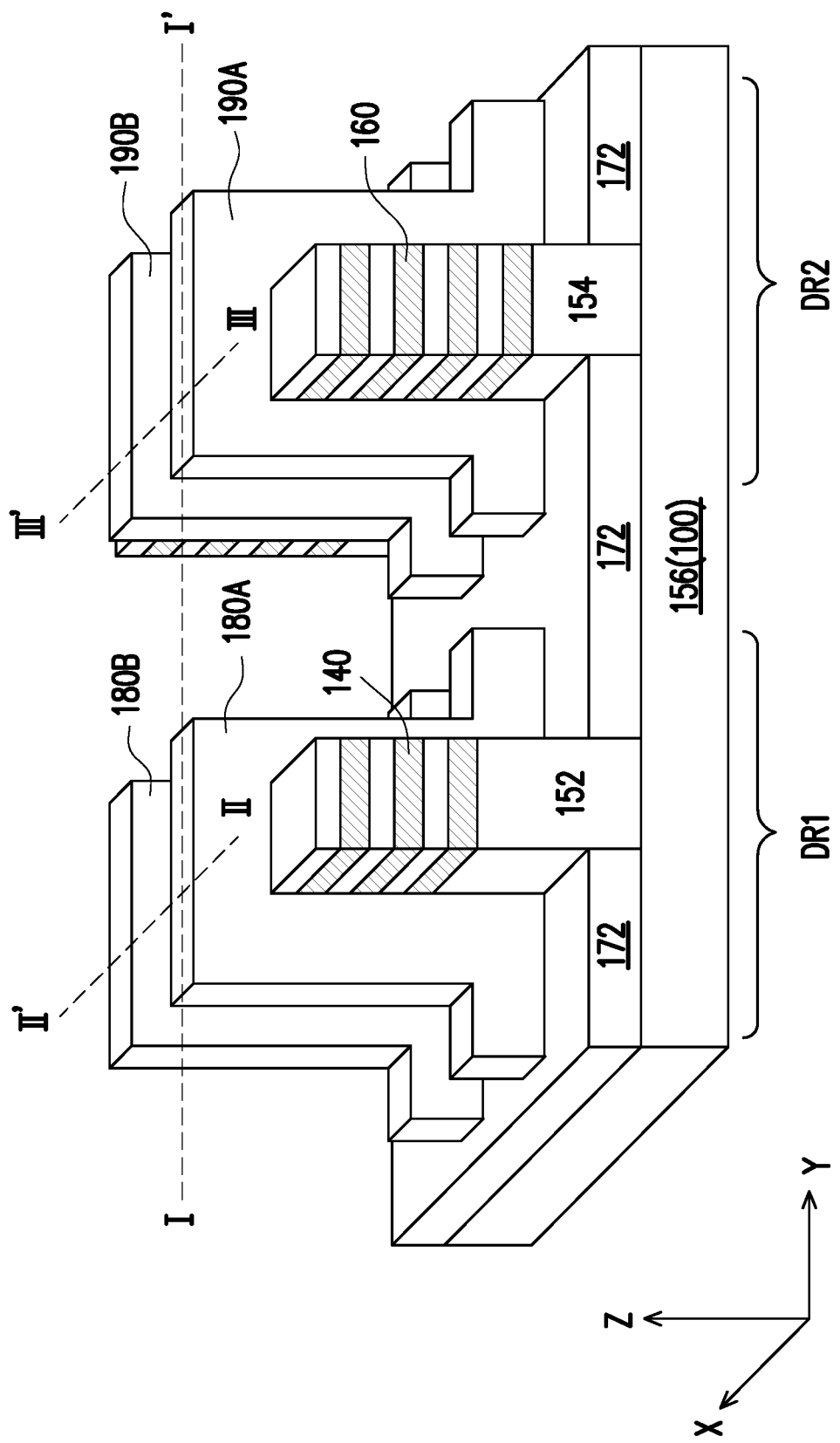
FIG. 9 is a perspective view of a structure produced during a manufacturing method of a semiconductor device according to some embodiments of the disclosure.
Figure 9B:
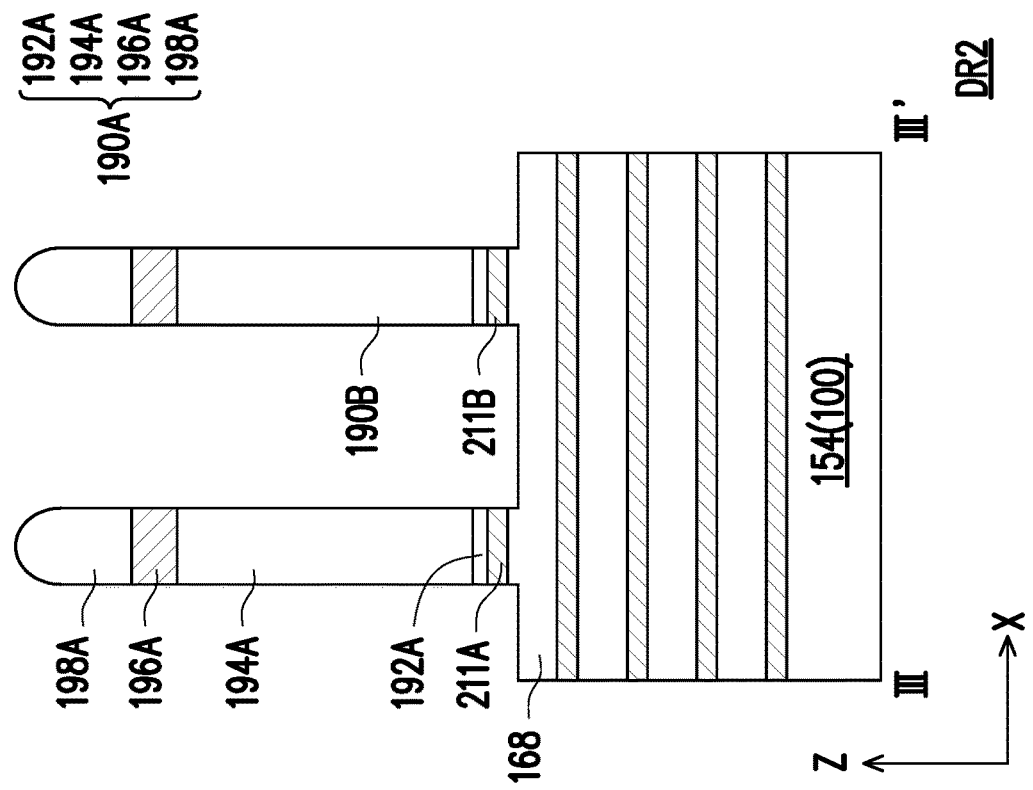
Figure 9A:
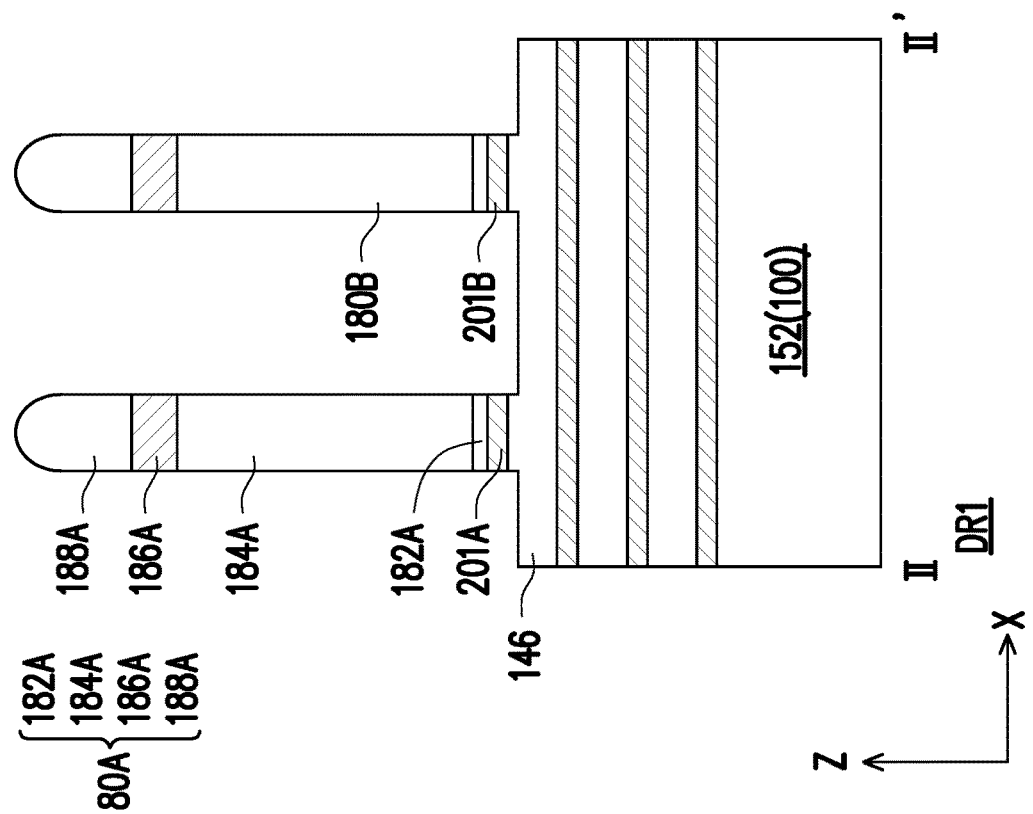

FIG. 9 is a schematic perspective view of a structure produced at a subsequent stage of the manufacturing process. FIG. 9A is a schematic cross-sectional view of the structure of FIG. 9 taken in the XZ plane at the level height of the line II-II' along the Y direction, cutting through the stack 140 on the device region DR1. FIG. 9B is a schematic cross-sectional view of the structure of FIG. 9 taken in the XZ plane at the level height of the line III-III' along the Y direction, cutting through the stack 160 on the device region DR2. Referring to FIG. 8, FIG. 9, FIG. 9A, and FIG. 9B, one or more dummy gate structures 180 are formed on the stack of semiconductor strips 140 and on the adjacent isolation structures 172 in the device region DR1. Similarly, one or more dummy gate structures 190 are formed on the stack of semiconductor strips 160 on the device region DR2. The dummy gate structures 180 and 190 may have an elongated shape along the Y direction, and be spaced along the X direction. One or more portions of the stacks 140, 160 may be surrounded on three sides by the corresponding dummy gate structures 180, 190. That is, the dummy gate structures 180, 190 may wind around a portion of the respective stacks 140, 160. In some embodiments, an extending direction of a dummy gate structure may be perpendicular to an extending direction of the stack of semiconductor strips around which the dummy gate structure is wound. In some embodiments, a dummy gate structure may extend from the stack 140 in the device region DR1 to the stack 160 in the device region DR2. For example, the dummy gate structure 180A illustrated in FIG. 9A and the dummy gate structure 190A illustrated in FIG. 9B may actually be part of the same dummy gate structure. In some embodiments, each dummy gate structure 180, 190 includes a dummy gate etch stop layer 182 or 192, a dummy gate body 184 or 194, and one or more dummy gate mask layers 186 and 188 or 196 and 198. In some embodiments, the dummy gate etch stop layers 182, 192 are formed to separate the stacks of semiconductor strips 140, 160 from the dummy gate bodies 184, 194. The dummy gate etch stop layers 182, 192 may include, for example, silicon oxide, silicon nitride, or silicon oxy-nitride. In some embodiments, the dummy gate etch stop layers 182, 192 may be formed using a suitable process such as atomic layer deposition (ALD), chemical vapor deposition (CVD), physical vapor deposition (PVD), thermal oxidation, UV-ozone oxidation, or combinations thereof. In some embodiments, the dummy gate bodies 184, 194 include a silicon-containing material, such as poly-silicon, amorphous silicon, or a combination thereof. The dummy gate bodies 184, 194 may be formed using a suitable process, such as ALD, CVD, PVD, plating, or combinations thereof. In some embodiments, the dummy gate bodies 184, 194 may be a single-layered structure or a multi-layered structure.

The dummy gate structures 180, 190 may be formed by blanketly depositing the materials of the constituting layers followed by one or more patterning steps. In some embodiments, the dummy gate structures 180, 190 are used as auxiliary masks during an etching step to pattern the uppermost strips 147 and 169 of the stacks 140 and 160 to form the nanosheets of sacrificial material 201 and 211, respectively. That is, the nanosheets of sacrificial material 201 are formed from the strip of sacrificial material 147 under the dummy gate structures 180, and the nanosheets of sacrificial material 211 are formed from the strip of sacrificial material 169 under the dummy gate structure 190. Upon patterning of the uppermost strips of sacrificial material 147 and 169, the uppermost strips of channel material 148 and 168 are exposed at the sides of the dummy gate structures 180 and 190. While in FIG. 9 are illustrated two dummy gate structures 180 or 190 formed on the corresponding stack 140 or 160, the disclosure is not limited thereto. In some alternative embodiments, fewer or more dummy gate structures 180, 190 may be formed on the stacks 140, 160 according to design requirements.

FIG. 10A to FIG. 16A are schematic cross-sectional views of structures produced at later stages of the manufacturing process, taken along the same XZ plane as FIG. 9A. FIG. 10B to FIG. 16B are schematic cross-sectional views of the corresponding structures of FIG. 10A to FIG. 16A, taken along the same XZ plane as FIG. 9B. Referring to FIG. 10A and FIG. 10B, gate spacers 220 and 230 are formed at the sides of the dummy gate structures 180 and 190, respectively. The gate spacers 220, 230 may cover the side surfaces of the dummy gate structures 180, 190, the two opposite ends (along the X direction) of the nanosheets of sacrificial material 201 and 211, and extend on a portion of the uppermost strips of channel material 146 and 168. In some embodiments, the gate spacers 220, 230 are formed of dielectric materials, such as silicon oxide, silicon nitride, silicon carbo-nitride (SiCN), SiCON, or a combination thereof. In some embodiments, the gate spacers 220, 230 are a single-layered structure. In some alternative embodiments, the gate spacers 220, 230 are a multi-layered structure. While in the present embodiment the gate spacers 220, 230 are bi-layered structures, the disclosure is not limited by the number of layers included in the gate spacers. In some alternative embodiments, fewer or more layers may be included according to the design requirements, for example one to five layers. In some embodiments, one or more spacer precursor layers (not shown) are blanketly formed over the semiconductor substrate 100, covering the stacks 140, 160, the isolation structures 172, and the dummy gates 180, 190. The spacer precursor layers may then be patterned to form the gate spacers 220 and 230.

In some embodiments, the stacks of semiconductor strips 140 and 160 may be patterned using the dummy gate structures 180, 190 as hard masks to form stacks 200 and 210 of semiconductor nanosheets, respectively. That is, portions of semiconductor material may be removed from the stacks 140, 160 and the strip bases 152, 154 at opposite sides (along the X direction) of the dummy gate structures 180, 190. For example, on the device region DR1, from the stack 140 may be formed two stacks of semiconductor nanosheets 200, separated by source and drain trenches 240. The source and drain trenches 240 may at least partially extend within the strip bases 152, resulting in the stacks of semiconductor nanosheets 200 being disposed on protrusions 158 of the semiconductor substrate 100. In some embodiments, each stack of semiconductor nanosheets 200 includes nanosheets of channel material 202, 204, 206 alternately stacked with nanosheets of sacrificial material 201, 203, 205, 207. For example, the nanosheets of channel material 202, 204, 206 are respectively formed from the strips of channel material 146, 144, 142, while the nanosheets of sacrificial material 201, 203, 205, 207 are respectively formed from the strips of channel material 147, 145, 143, 141. In some embodiments, the topmost nanosheet of sacrificial material 201 has a smaller extension (is shorter) along the X direction than the remaining nanosheets 202-207 of the same stack 200. Similarly, the stack of semiconductor strips 160 is patterned to form the stacks of semiconductor nanosheets 210 having source and drain trenches 250 at each side with respect to the X direction. In some embodiments, the source and drain trenches 240 and 250 are opened simultaneously during the same etching process, resulting in trenches of similar depth. Because the stacks 210 on the device region DR2 include at least two more nanosheets (e.g., the nanosheets 218, 219 formed from the semiconductor strips 161, 162) than the stacks 200 on the device region DR1, the distance D1 from the bottom (lower) surface 2061 of the bottommost nanosheet of channel material 206 to the bottom of the source and drain trench 240 may be larger than the distance D2 from the bottom (lower) surface 2181 of the bottommost nanosheet of channel material 218 to the bottom of the source and drain trench 250. In some embodiments, the bottom surface of a nanosheet is considered the outer surface of the nanosheet closer to the semiconductor substrate 100 (located at a lower level height along the Z direction with respect to the other outer surfaces of the same nanosheet). In some embodiments, the bottom of the source and drain trench 240 or 250 is considered the point of minimum thickness along the Z direction of the semiconductor substrate 100 exposed by the corresponding source and drain trench 240 or 250. In some embodiments, the total thickness of the semiconductor substrate 100 (the combined thickness of the semiconductor base 156 and the strip base 152 including the protrusion 158) along the Z direction below the stacks 200 is larger than the total thickness of the semiconductor substrate 100 (the combined thickness of the semiconductor base 156 and the strip base 154, in which the protrusion 158 is not formed) along the Z direction below the stacks 210.

Figure 11B:
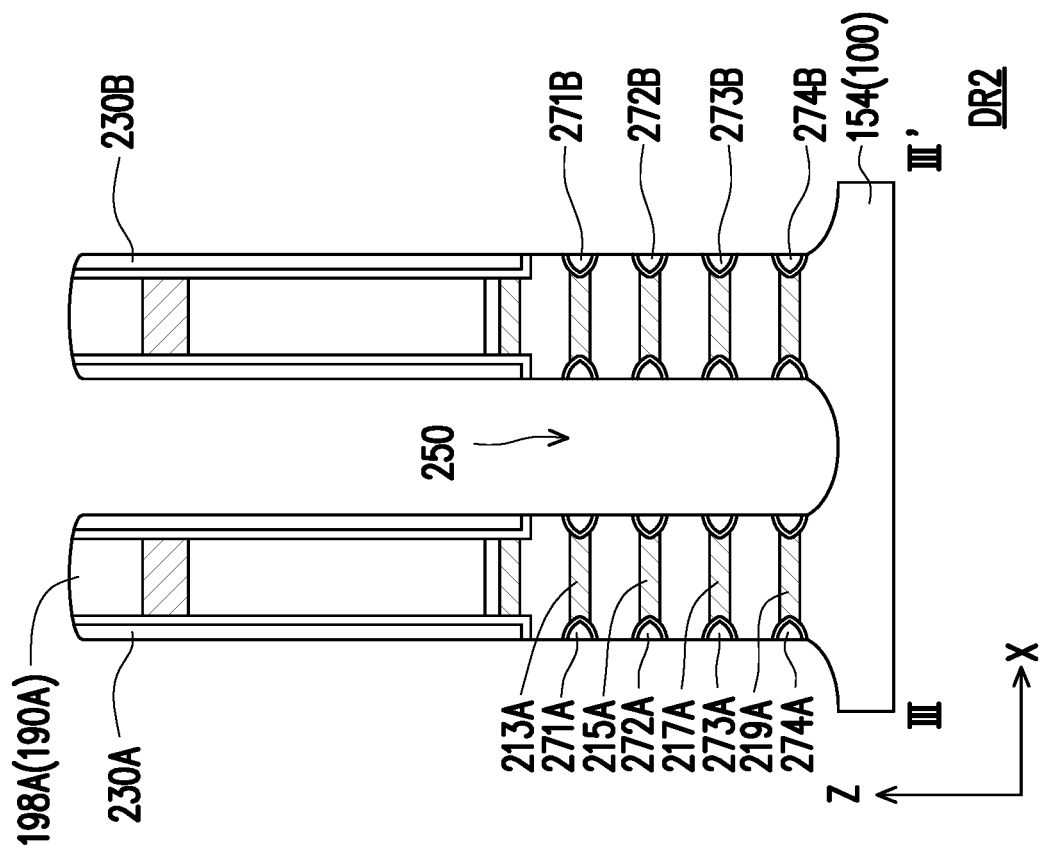
Figure 11A:
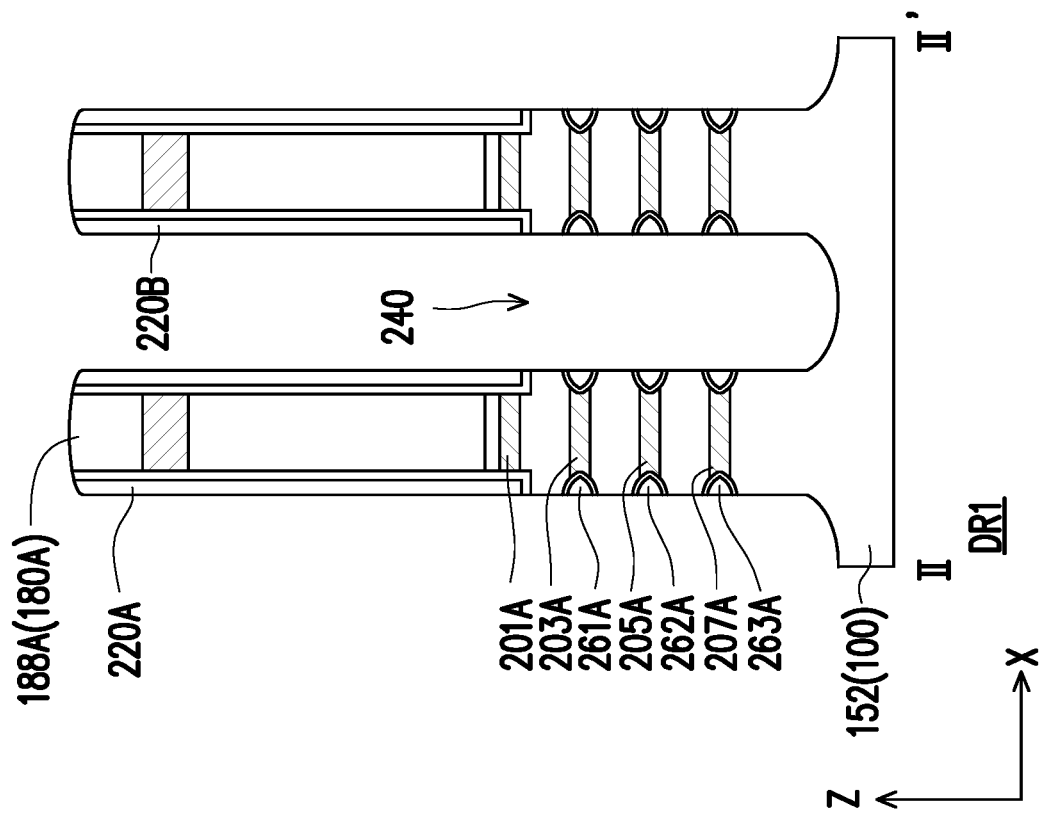
Figures 12A, 12B:
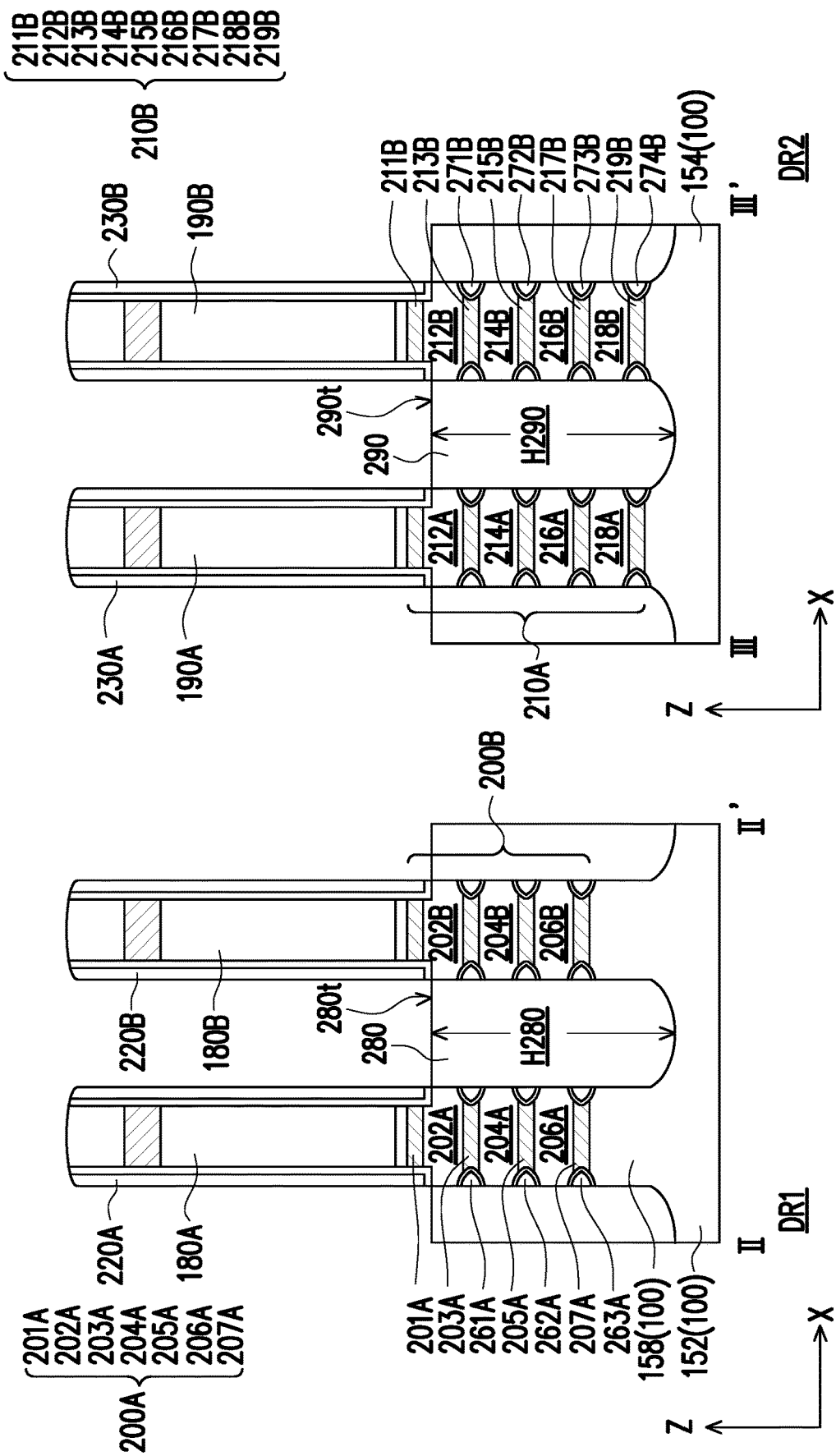

Referring to FIG. 11A and FIG. 11B, in some embodiments an etching process is performed to remove the extremities along the X direction of the nanosheets of sacrificial material 203, 205, 207, and 213, 215, 217, 219 (e.g., the nanosheets of sacrificial material not covered by the gate spacers 220 and 230). Thereafter, inner spacers 261-263 and 271-274 are formed at both ends of the remaining portions of the nanosheets of sacrificial material, to prevent out-diffusion of material during subsequent steps of the manufacturing process. In some embodiments, the inner spacers 261-263, 271-274 include dielectric materials, such as silicon oxide, silicon nitride, carbonized silicon nitride (SiCN), SiCON, or a combination thereof. In some embodiments, the inner spacers 261-263, 271-274 may be formed by patterning a liner layer (not shown) which is blanketly formed along the sides of the stacks of semiconductor nanosheets 200, 210 and the overlying dummy gate structures 180, 190 and gate spacers 220, 230. The profile (shape) of the inner spacers 261-263, 271-274 is not particularly limited. For example, the inner spacers may have the profile of a square, of an arc, of concentric circles, or a concave shape like a bowl.

Referring to FIG. 11A, FIG. 11B, FIG. 12A, and FIG. 12B, source and drain regions 280 and 290 are formed in the source and drain trenches 240 and 250. In some embodiments, the source and drain regions 280 are epitaxially grown from the channel material of the nanosheets 202, 204, 206 of the stacks 200 and the strip base 152. Similarly, the source and drain regions 290 are epitaxially grown from the channel material of the nanosheets 212, 214, 216, 218 and the strip base 154. In some embodiments, the source and drain regions 280, 290 reach a level height along the Z direction sufficient to cover the nanosheets 202-207, 212-219 not covered by the gate spacers 220 and 230. In some embodiments, the height H280 of the source and drain regions 280 on the device region DR1 along the Z direction is substantially equal to the height H290 of the source and drain regions 290 on the device region DR2.

In some embodiments, a material of the source and drain regions 280, 290 may differ from the channel material of the nanosheets 202, 204, 206, 212, 214, 216, 218. In some embodiments, the material of the source and drain regions 280, 290 is doped with a conductive dopant. For example, a strained material, such as SiGe, may be epitaxially grown with a p-type dopant for straining the source and drain region 280, 290 in p-type regions. Possible p-type dopants include, for example, boron or $BF_2$, and the strained material may be epitaxially grown by LPCVD process with in-situ doping. In some alternative embodiments, the strained material, such as SiC, SiP, a combination of SiC/SiP, or SiCP, is epitaxially grown with an n-type dopant for straining the source and drain regions 280, 290 n-type regions. Possible n-type dopants include arsenic and/or phosphorus, and the strained material may be epitaxially grown by LPCVD process with in-situ doping. In some embodiments, the material within the source and drain regions 280, 290 may be disposed as a single-layered structure. In some alternative embodiments, the material of the source and drain regions 280, 290 is disposed as a multi-layered structure, with different layers having different degrees of doping.

Figure 13B:
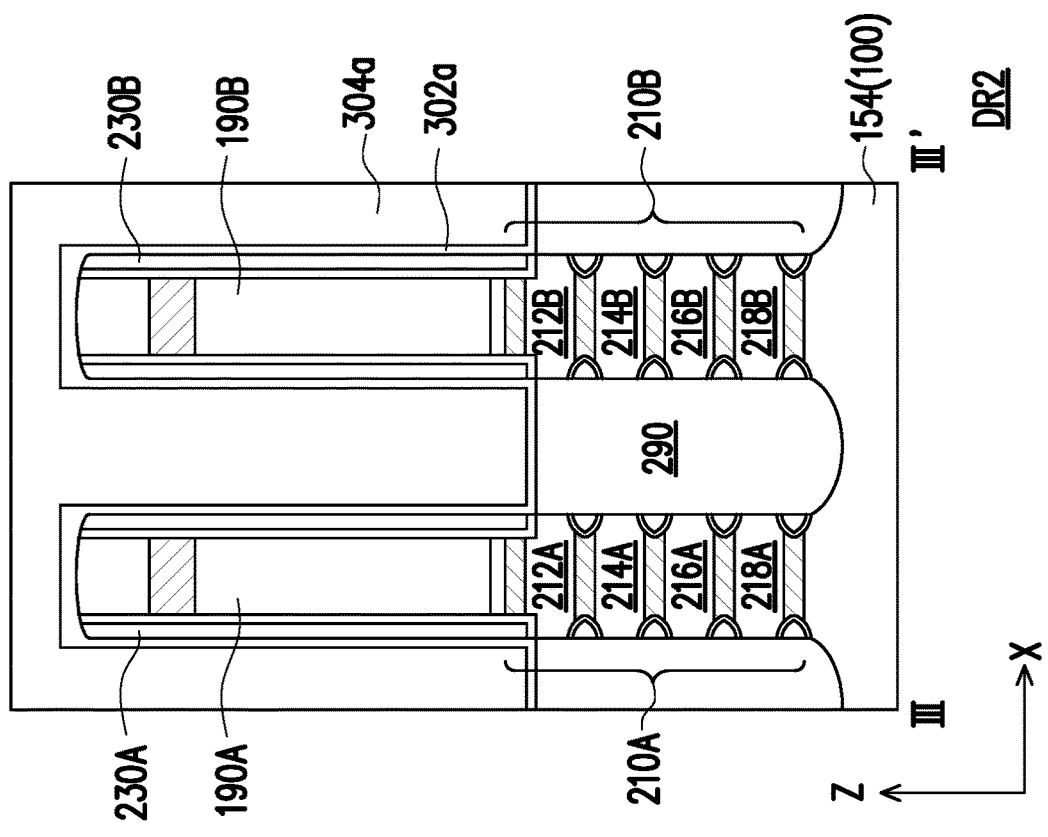
Figure 13A:
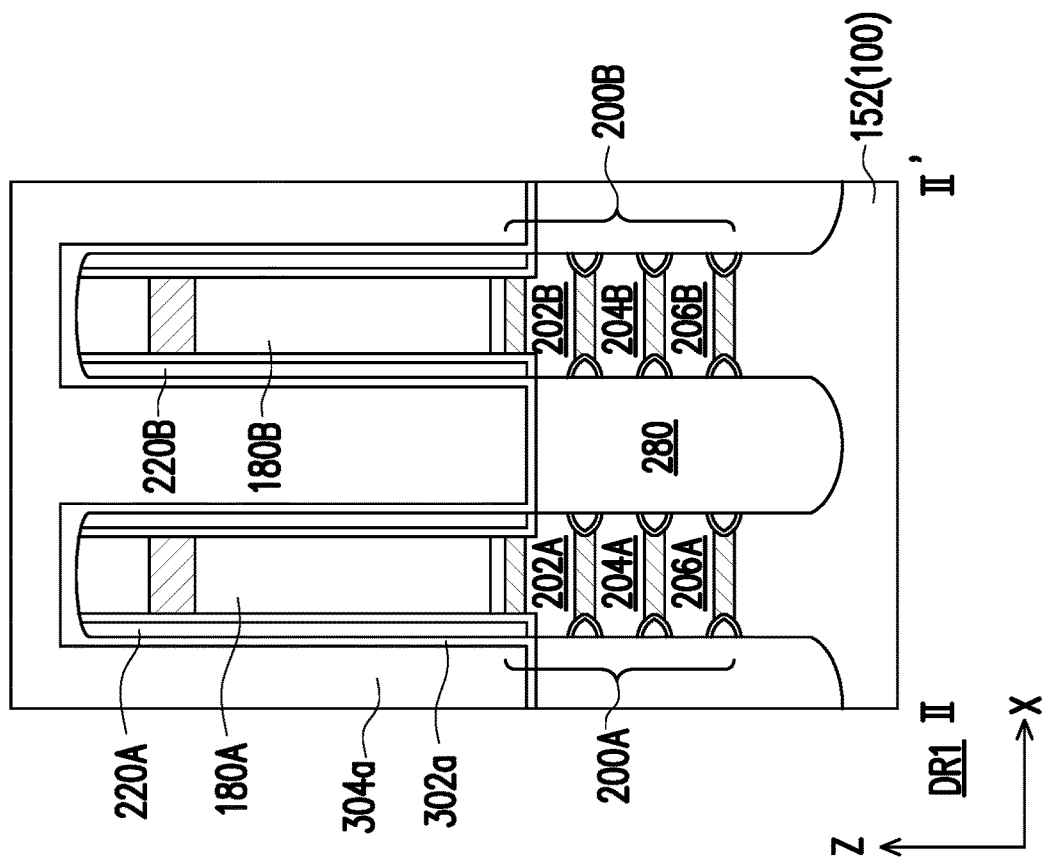

Referring to FIG. 13A and FIG. 13B, a blanket etch stop layer 302a and a blanket interlayer dielectric layer 304a are sequentially formed over the semiconductor substrate 100 in the device regions DR1 and DR2. The blanket etch stop layer 302a may blanketly cover the isolation structures 172 (illustrated, e.g., in FIG. 8), the source and drain regions 280, 290, and the dummy gate structures 180, 190 with the corresponding gate spacers 220, 230. The blanket interlayer dielectric layer 304a may be formed on the blanket etch stop layer 302a and may be initially formed of a thickness along the Z direction sufficient to bury the dummy gate structures 180, 190 with the corresponding gate spacers 220, 230. In other words, the blanket etch stop layer 302a and the blanket interlayer dielectric layer 304a are formed in between adjacent gate spacers 220, 230 (e.g., in between the gate spacers 220A and the gate spacers 220B, and so on), at the sides of the dummy gate structures 180, 190. In some embodiments, a material of the blanket etch stop layer 302a includes dielectric materials, for example nitrides such as silicon nitride. In some embodiments, a material of the blanket interlayer dielectric layer 304a includes low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. It is understood that the blanket interlayer dielectric layer 304a may include one or more dielectric materials or one or more dielectric layers. In some embodiments, the blanket interlayer dielectric layer 304a is formed to a suitable thickness by flowable CVD (FCVD), CVD, HDPCVD, SACVD, spin-on, sputtering, or other suitable methods.

Referring to FIG. 13A, FIG. 13B, FIG. 14A, and FIG. 14B, a planarization process may be performed removing portions of the blanket interlayer dielectric layer 304a and the blanket etch stop layer 302a to form the interlayer dielectric layer 304 and the etch stop layer 302. In some embodiments, the planarization process is performed until the dummy gate structures 180, 190 are exposed. During the planarization process, portions of the gate spacers 220, 230 and of the dummy gate structures 180, 190 may also be removed. Once the dummy gate structures 180, 190 are exposed, the dummy gate structures 180, 190 are selectively removed, for example via an etching process, to form gate trenches 310 and 320 in between the gate spacers 220 and 230, respectively. The gate trenches 310 and 320, extending along the Y direction as the dummy gate structures 180, 190, expose the sides and the top of the stacks 200 and 210. For example, the uppermost nanosheets of sacrificial material 201 and 211 are exposed at the bottom of the gate trenches 310 and 320 on top of the stacks 200 and 210, respectively. Furthermore, the nanosheets 201-207, 211-219 of the stacks 200, 210 are also exposed at different level heights along the Y direction than the one illustrated in FIG. 14A and FIG. 14B. A selective etching step may be performed to remove the nanosheets of sacrificial material 201, 203, 205, 207, 211, 213, 215, 217, 219 while retaining the nanosheets of channel material 202, 204, 206, 212, 214, 216, 218, thus forming extended gate trenches 315, 325 which surround (wrap around) the nanosheets of channel material 202, 204, 206, 212, 214, 216, 218 and expose at their bottom the strip bases 152, 154, as illustrated in FIG. 15A and FIG. 15B.

Referring to FIG. 15A, FIG. 15B, FIG. 16A, and FIG. 16B, gate structures 330 are formed in the extended gate trenches 315 on the device region DR1, and gate structures 340 are formed in the gate trenches 325 on the device region DR2, respectively. The gate structures 330, 340, extend along the corresponding spacers 220, 230, wrap around the nanosheets of channel material 202, 204, 206, 212, 214, 216, 218, and extend on top of the strip bases 152, 154 below the stacks 200 and 210, respectively. The gate structures 330, 340 may extend along the Y direction on the isolation structures 172 (illustrated, e.g. in FIG. 8), conformally cover the strip bases 152, 154, and wrap around the exposed sections of the nanosheets of channel material 202, 204, 206, 212, 214, 216, 218. In some embodiments, multiple gate structures 330, 340 extend parallel with respect to each other along the Y direction and are spaced from each other along the X direction. Depending on the width along the X direction of the extended gate trenches 315, 325, the gate structures may fill partially or completely the extended gate trenches 315, 325. In some embodiments, the gate structures 330, 340 are formed by sequential deposition of multiple layers to form a blanket gate structure (not shown) extending over the interlayer dielectric layer 304. A planarization process may be performed on the blanket gate structure until the interlayer dielectric layer 304 is exposed, resulting in the gate structures 330, 340 being substantially coplanar with the interlayer dielectric layer 304. In some embodiments, each gate structure 330 or 340 includes an oxide interface layer 332 or 342, a high-k dielectric layer 324 or 344, a work function layer 336 or 346, and a gate electrode 338 or 348.

The oxide interface layers 332, 342 may include a dielectric material such as silicon oxide or silicon oxynitride (SiON). In some embodiments, the oxide interface layers 332, 342 are formed on the exposed sections of the nanosheets of channel material 202, 204, 206, 212, 214, 216, 218 and of the strip bases 152, 154 through an oxidation process. For example, the channel material may be oxidized with a wet process or via thermal oxidation. In some alternative embodiments, the oxide interface layers 332, 342 may be formed by a deposition process such as atomic layer deposition (ALD), chemical vapor deposition (CVD), and/or other suitable deposition methods. In such alternative embodiments, the profile of the oxide interface layers 332, 342 may appear differently than the ones illustrated in FIG. 16A and FIG. 16B. For example, the oxide interface layers 332, 342 may further extend along the corresponding gate spacers 220, 230, in between the gate spacers 220, 230 and the high-k dielectric layers 334, 344. In some embodiments, the oxide interface layers 332, 342 may provide increased adhesion between the semiconductor surfaces (i.e., the channel material) and the high-k dielectric layers 334, 344.

In some embodiments, the high-k dielectric layers 334, 344 are formed over the oxide interface layer 332, 342 and the gate spacers 220, 230. In some embodiments, the high-k dielectric layers 334, 344 have a dielectric constant greater than about 4, greater than about 12, greater than about 16, or even greater than about 20. For example, a material of the high-k dielectric layers 334, 344 may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or other suitable materials. In some alternative embodiments, the material of the high-k dielectric layers 334, 344 may include a silicate such as HfSiO, HfSiON LaSiO, AlSiO, or a combination thereof. In some embodiments, the method of forming the high-k dielectric layers 334, 344 includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

In some embodiments, the work function layers 336, 346 are formed over the high-k dielectric layers 334, 344. In some embodiments, the work function layers 336, 346 may include band edge materials to tune the threshold voltage of the transistors. For example, the work function layers 336, 346 may include TiN, TaN, titanium aluminum carbine ($TiAl_xC$), hafnium oxides ($HfO_x$), aluminum oxides ($AlO_x$) lanthanum oxides ($La_xO_x$), or other suitable band edge materials. In some embodiments, a material of the work function layers 336, 346 may be selected according to the conductivity type of the corresponding transistor. For example, for p-type transistors the work function layers 336, 346 may include TiN, TaN, Ru, Mo, Al, WN, $ZrSi_2$, $MoSi_2$, $TaSi_2$, $NiSi_2$, WN, $TiAl_xC$, $HfO_x$, $AlO_x$, $La_xO_x$, or a combination thereof, and for n-type transistors, the work function layers 336, 346 may include Ti, Ag, TaAl, TaAlC, TiAlN, TaC, TaCN, TaSiN, Mn, Zr, $TiAl_xC$, $HfO_x$, $AlO_x$, $La_xO_x$ or a combination thereof. In some embodiments, the method of forming the work function layers 334, 344 includes performing at least one suitable deposition technique, such as CVD, PECVD, ALD, RPALD, PEALD, MBD, or the like.

In some embodiments, the gate electrodes 338, 348 are formed over the work function layers 336, 346. In some embodiments, a material of the gate electrodes 338, 348 includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some embodiments, the gate structures 330, 340 may further include additional barrier layers, work function layers, liner layers, interface layers, seed layers, adhesion layers, etc.

Figure 16A:
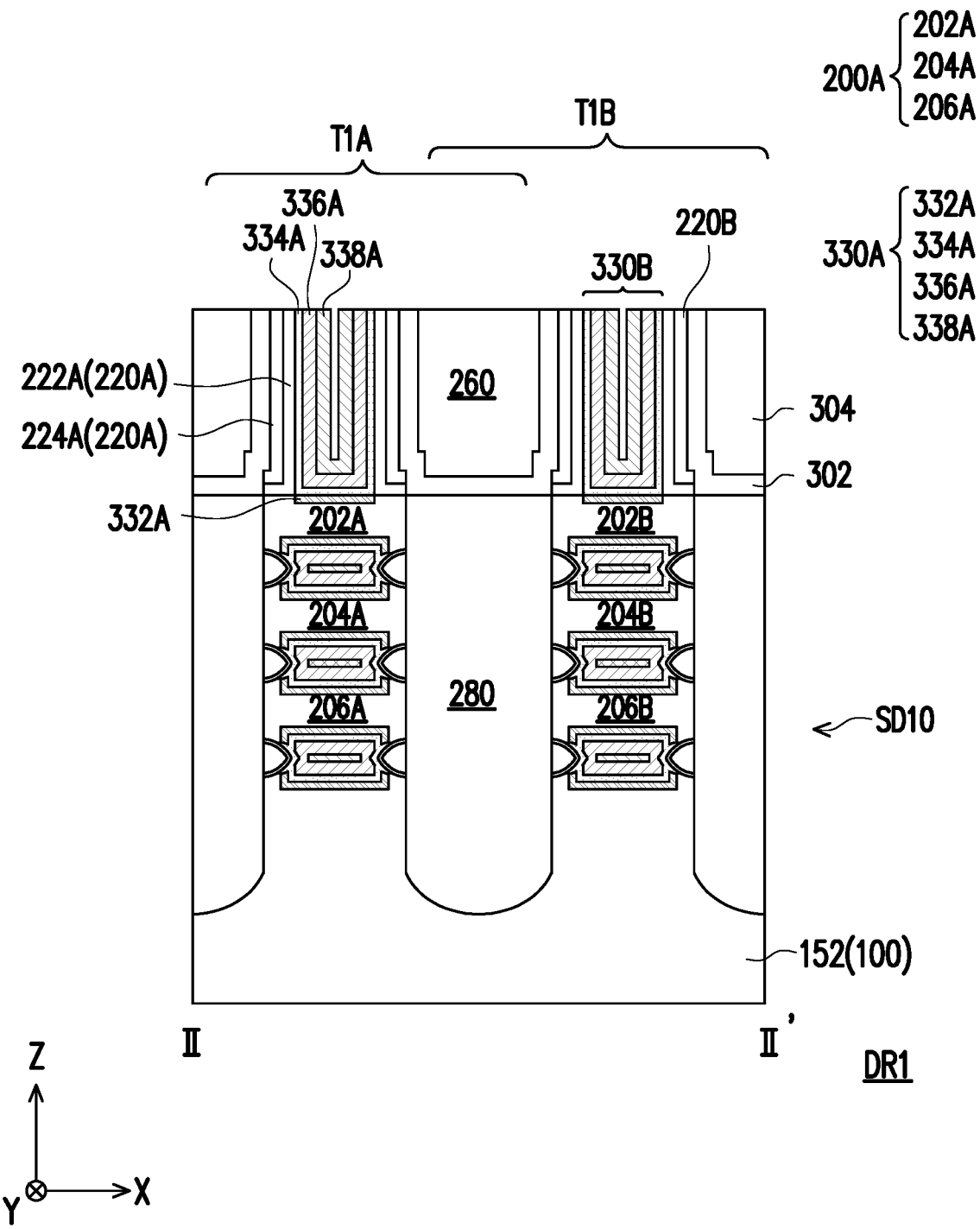
Figure 16B:
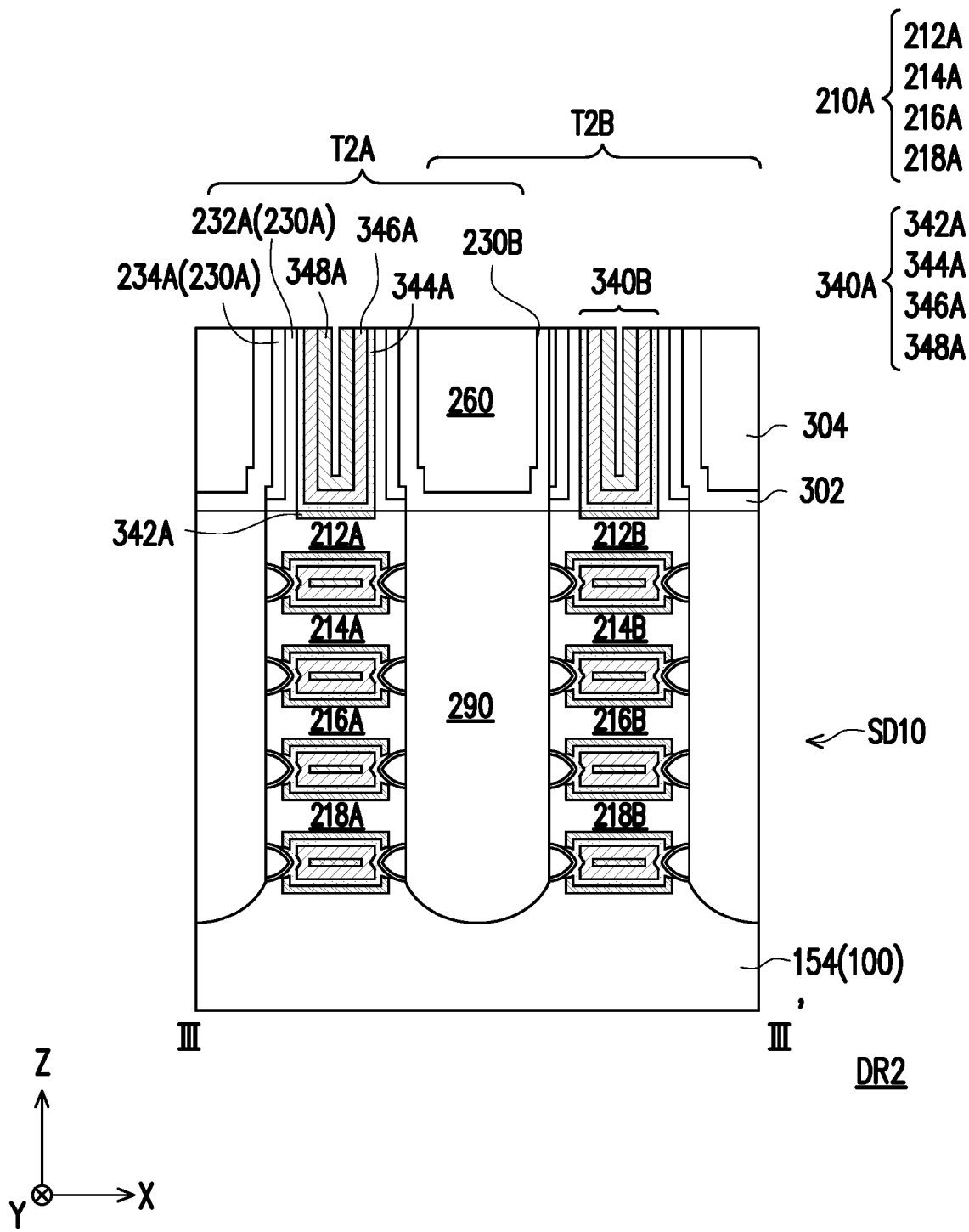

As illustrated in FIG. 16A and FIG. 16B, the semiconductor device SD10 includes one or more device regions DR1, DR2 having active devices (e.g., the transistors T1, T2) formed thereon. Each transistor T1 and T2 includes a pair of source and drain regions 280 or 290 connected by nanosheets of channel material 202, 204, 206, 212, 214, 216, 218 which act as channels of the corresponding transistor T1 or T2. That is, the electrical charges (holes or electrons, according to the configuration of the transistors T1 and T2) are transported mostly along the nanosheets of channel material 202, 204, 206, 212, 214, 216, 218 and, in part, on the portions of the strip bases 152, 154 contacted by the gate structures 330, 340 below the stacks of nanosheets 200 and 210. In some embodiments, some or all of the transistors T1 of the device region DR1 have fewer nanosheets of channel material 202, 204, 206 than the transistors T2 of the device region DR2, which include at least one more nanosheet of channel material (e.g., the nanosheets 212, 214, 216, 218). In some embodiments, because the transistors T1 include a different number of nanosheets of channel material 202, 204, 206 than the transistors T2, it is possible to balance the current between the transistors T1, T2 of the device regions DR1, DR2. That is, in the semiconductor device SD10, because the number of nanosheets of channel material (e.g., 202, 204, 206, 212, 214, 216, 218) included in the transistors T1, T2 can be individually varied, the electrical characteristics of the individual transistors T1, T2 can be better tuned taking into account the requirements of the intended application. For example, the device region DR1 may include NMOS (n-type metal-oxide-semiconductor) devices and the device region DR2 may include PMOS (p-type metal-oxide-semiconductor) devices, and current balance between the NMOS devices and the PMOS devices may be achieved by differentiating the number of active channels (the nanosheets of channel material connecting the source and drain regions) between the NMOS devices and the PMOS devices. For example, in the semiconductor device SD10 core and SRAM performances could be tuned for DC/AC applications.

Figure 17A:
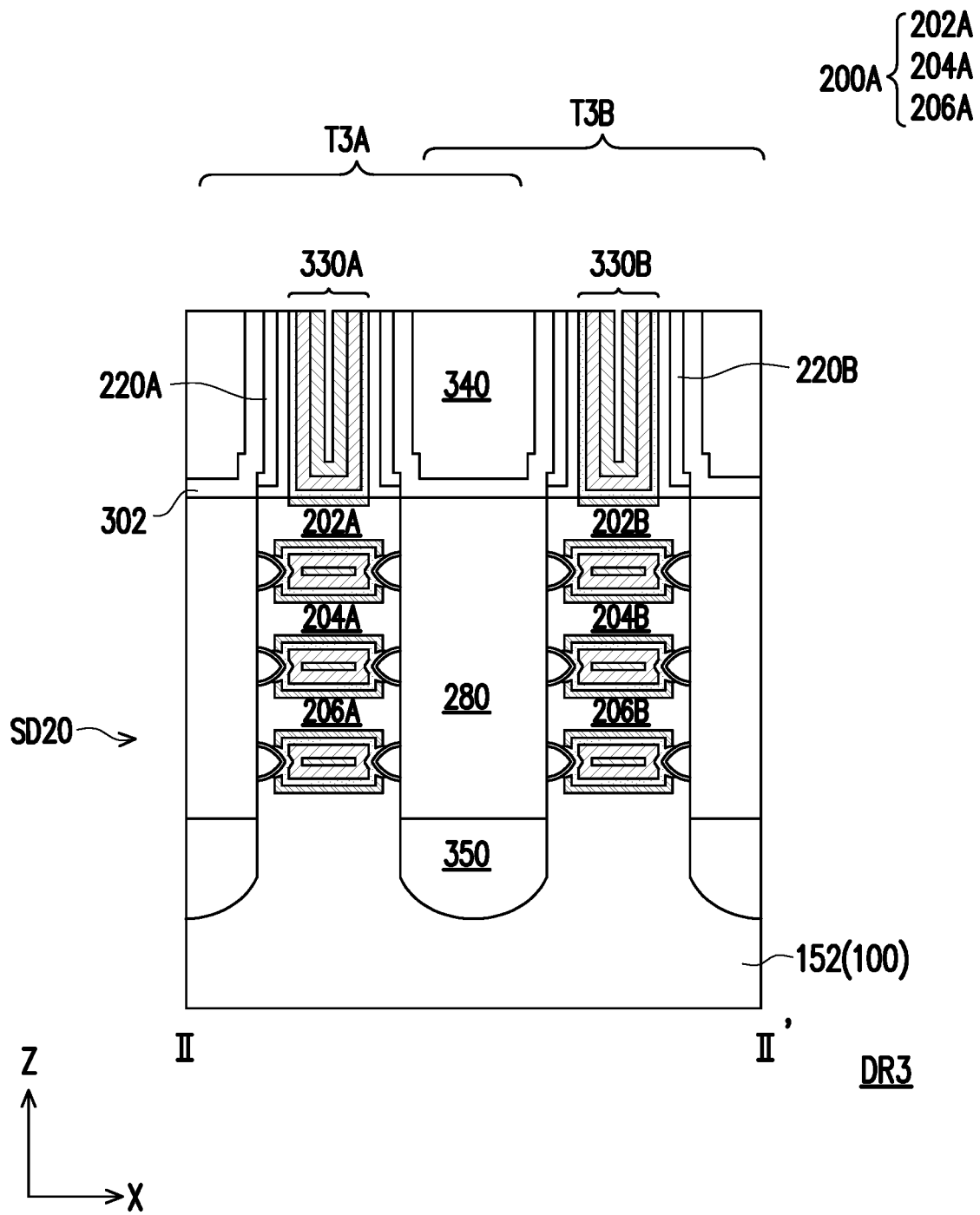
FIG. 17A and FIG. 17B are schematic cross-sectional views of regions of a semiconductor device according to some embodiments of the disclosure.
Figure 17B:
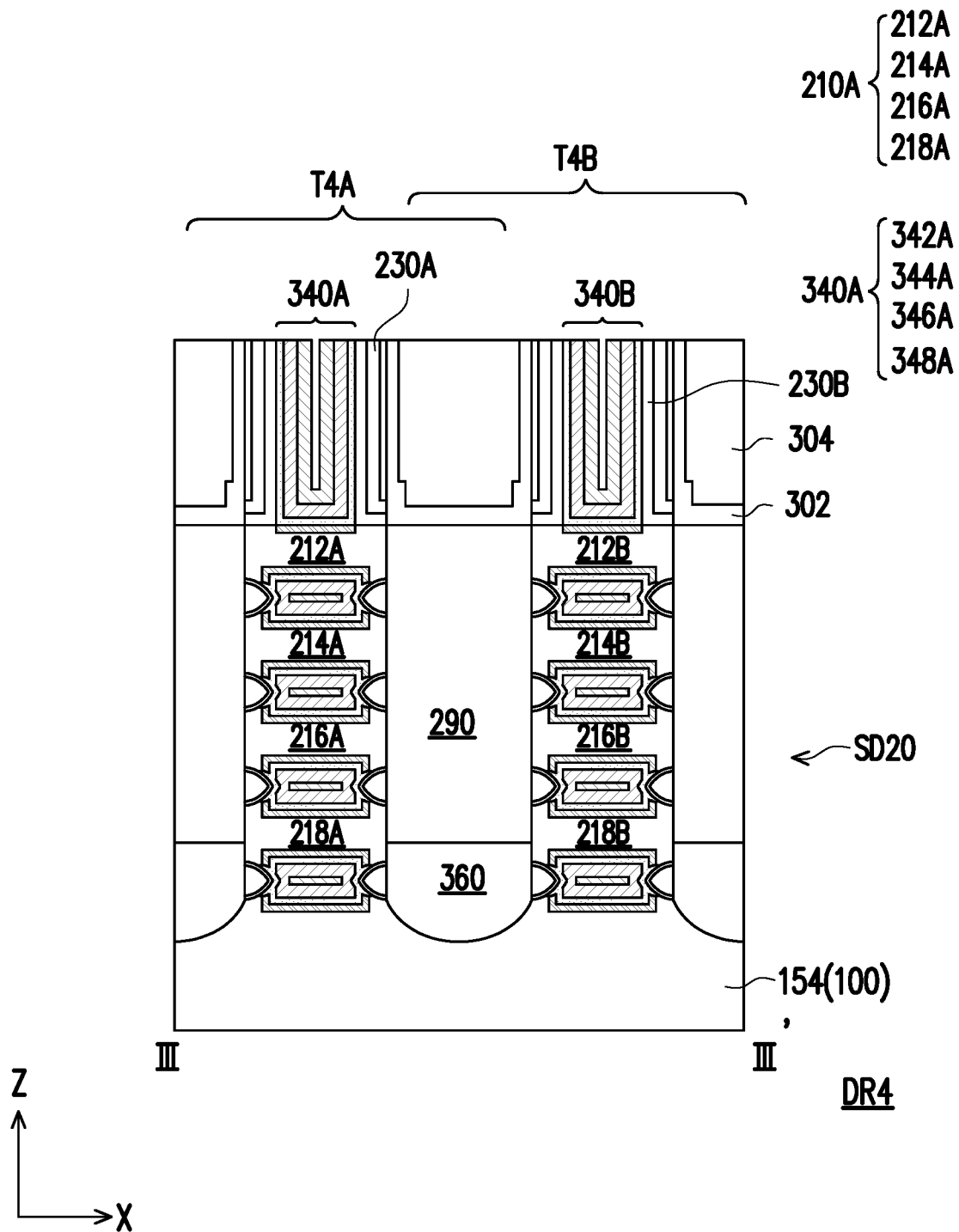
Figure 22:
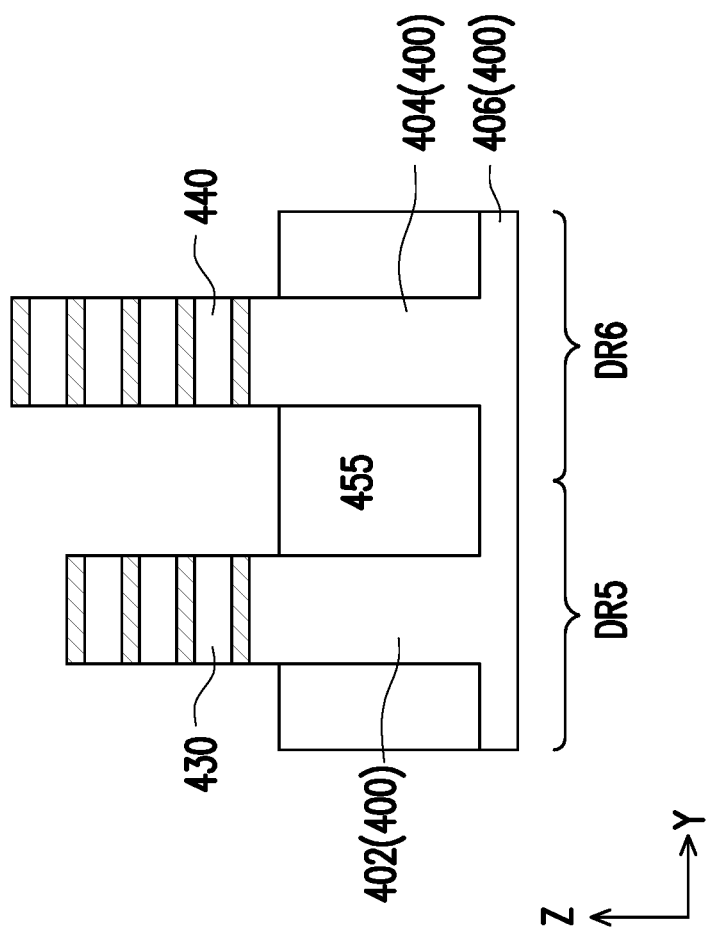

FIG. 17A and FIG. 17B are schematic cross-sectional views of portions of a semiconductor device SD20 according to some embodiments of the disclosure. The cross-sectional view of FIG. 17A is taken in the device region DR3 of the semiconductor device SD20, in an XZ plane corresponding to the XZ plane of the cross-sectional view of FIG. 16A. Similarly, the cross-sectional view of FIG. 17B is taken in the device region DR4 of the semiconductor device SD20, in an XZ plane corresponding to the XZ plane of the cross-sectional view of FIG. 16B. The semiconductor device SD20 has a similar structure and may be fabricated following similar processes as previously described for the semiconductor device SD10 of FIG. 16A and FIG. 16B. In some embodiments, the semiconductor device SD20 further includes source and drain dielectric layers 350, 360 disposed at the bottom of the source and drain regions 280, 290. In some embodiments, the source and drain dielectric layer 350 is formed between the source and drain regions 280 and the strip base 152, and the source and drain dielectric layer 360 is formed between the source and drain regions 290 and the strip base 154. In some embodiments, the source and drain dielectric layers 350, 360 may include silicon nitrides (e.g., SiN, $SiO_xC_xN_x$, SiCN) or metal oxides (e.g., $AlO_x$, $HfO_x$, $LaO_x$, $HfAlO_x$). In some embodiments, the source and drain dielectric layers 350, 360 may be formed by suitable deposition techniques. For example, the material of the source and drain dielectric layers may be formed by bottom-up deposition, or by a deposition followed by an etch back step to the desired final height. In some embodiments, the source and drain dielectric layers 350, 360 may be formed in the corresponding source and drain trenches (e.g., the source and drain trenches 240, 250 illustrated in FIG. 11A and FIG. 11B) before forming the source and drain regions 280, 290. In some embodiments, the source and drain dielectric layers 350, 360 may prevent contact between the source and drain regions 280, 290, with the channel material of the semiconductor substrate 100 or of nanosheets which are not used as active channels.

FIG. 18 to FIG. 25B are schematic cross-sectional views of structures produced during a manufacturing process of a semiconductor device SD30 according to some embodiments of the disclosure. The schematic cross-sectional views of FIG. 18 to FIG. 22 are taken in a YZ plane corresponding to the YZ plane of the cross-sectional view of FIG. 1 to FIG. 8. Referring to FIG. 18, a semiconductor substrate 400 is provided. The semiconductor substrate 400 may include similar materials as discussed above for the semiconductor substrate 100 of FIG. 1. The semiconductor substrate 400 may include one or more device regions DR5, DR6, which may differ, for example, for the type and/or concentration of dopants. A stack 410 of semiconductor layers 410-419 is formed on the semiconductor substrate 400, for example via epitaxial growth. The stack 410 includes layers of sacrificial material 411, 413, 415, 417, 419 alternately stacked with layers of channel material 412, 414, 416, 418. In some embodiments, the same number of semiconductor layers 411-419 is formed on the device region DR5 and the device region DR6. The channel material and the sacrificial material may be selected from the same options listed above for the semiconductor layers 121-129 of FIG. 5. In some embodiments, the layers of channel material 412, 414, 416, 418 and the semiconductor substrate 400 include the same material. For example, silicon (Si) may be used as channel material and silicon germanium (SiGe) may be used as sacrificial material, however, the disclosure is not limited thereto. Other combinations of materials which can be selectively etched with respect to each other may be used, and fall within the scope of the present disclosure.

Referring to FIG. 18 and FIG. 19, hard masks 420 are formed on the stack of semiconductor layers 410 in a similar fashion as what was previously described for the hard masks 130 (illustrated, e.g., in FIG. 6). The hard masks 420 are then used to pattern the stack of semiconductor layers 410 and the semiconductor substrate 400, to form the stacks of semiconductor strips 430 and 440, respectively disposed on the strip bases 402 and 404, for example during one or more etching steps. The strip bases 402 and 404 protrude from the common semiconductor base 406. In some embodiments, the combined height H3 along the Z direction of the strip base 402 and the semiconductor base 406 may be substantially equal to the combined height H4 along the Z direction of the strip base 404 and the semiconductor base 406. In some embodiments, at the stage of the manufacturing process illustrated in FIG. 19, the stack of semiconductor strips 430 formed on the device region DR5 includes the same number of semiconductor strips (431-439) as the stack of semiconductor strips 440 formed on the device region DR6.

Referring to FIG. 19 and FIG. 20, the insulating material 450 is disposed over the semiconductor substrate 400, in a similar fashion to what was previously described for the insulating material 170 (illustrated in FIG. 7). Following a planarization process, the top surface 450t of the insulating material 450 may be substantially coplanar with the top surfaces 420t of the hard masks 420. Referring to FIG. 20 and FIG. 21, the hard masks 420 may be selectively removed to expose the underlying stacks of semiconductor strips 430 and 440, for example via one or more etching steps. In some embodiments, an auxiliary mask 460 is formed on the device region DR6, covering the insulating material 450 and the stack of semiconductor strips 440. The auxiliary mask 460 may include a positive photoresist or a negative photoresist, and may be formed, for example, via a sequence of deposition, photolithography, and etching steps. In some embodiments, the auxiliary mask 460 leaves exposed the device region DR5. In particular, the stack 430 may be exposed through the trench 470 formed upon removal of the hard mask 420A. The uppermost strip of sacrificial material 439 and the uppermost strip of channel material 438 may be removed, for example during one or more etching steps, thus exposing the strip of sacrificial material 437. That is, upon removal of the semiconductor strips 438 and 439, the uppermost strip of the stack 430 is the strip of sacrificial material 437. Because the auxiliary mask 460 covers the stack 440 on the device region DR6 while the uppermost strips 438, 439 of the stack 430 on the device region DR5 are removed, the stack 430 is selectively shortened. That is, at the stage of the manufacturing process illustrated in FIG. 21, the stack 430 includes fewer semiconductor strips 431-437 than the stack 440. The number of semiconductor strips removed from the stack 430 is not particularly limited. In some embodiments, a strip of sacrificial material (e.g., the semiconductor strip 437) remains as uppermost strip of the stack 430. For example, in some alternative embodiments two or more pairs of strips of channel material and sacrificial material may be removed from the stack 430. As such, the uppermost strip of channel material (e.g., 436) of the stack 430 is located at a lower level height than the uppermost strip of channel material (e.g., 448) of the stack 430.

The subsequent steps of the manufacturing process may be substantially similar to the ones previously described with reference from FIG. 8 to FIG. 16B, and will be only briefly summarized in the following. Corresponding elements between the two embodiments may be fabricated employing similar materials and following similar processes. The cross-sectional views of FIG. 23A to FIG. 25A are taken in an XZ plane corresponding to the XZ plane of the cross-sectional view of FIG. 16A (passing through the stack 430 on the device region DR5). Similarly, the cross-sectional views of FIG. 23B to FIG. 25B are taken in an XZ plane corresponding to the XZ plane of the cross-sectional view of FIG. 17B (passing through the stack 440 on the device region DR6). Briefly, the auxiliary mask 460 is removed (for example, via ashing or stripping), and the insulating material 450 is recessed to form the isolation structures 455 (illustrated, e.g., in FIG. 22). In some embodiments, the upper portions of the strip bases 402 and 404 and the stacks 430 and 440 are exposed by the isolation structures 455.

Figure 23B:
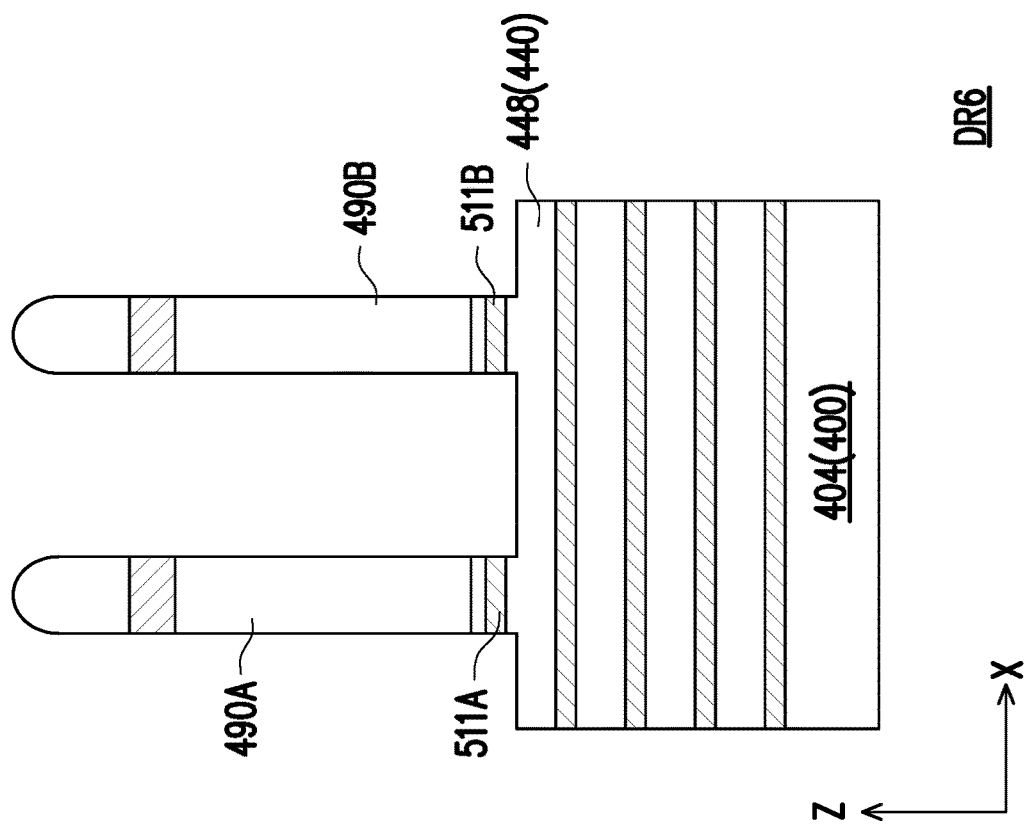
Figure 23A:
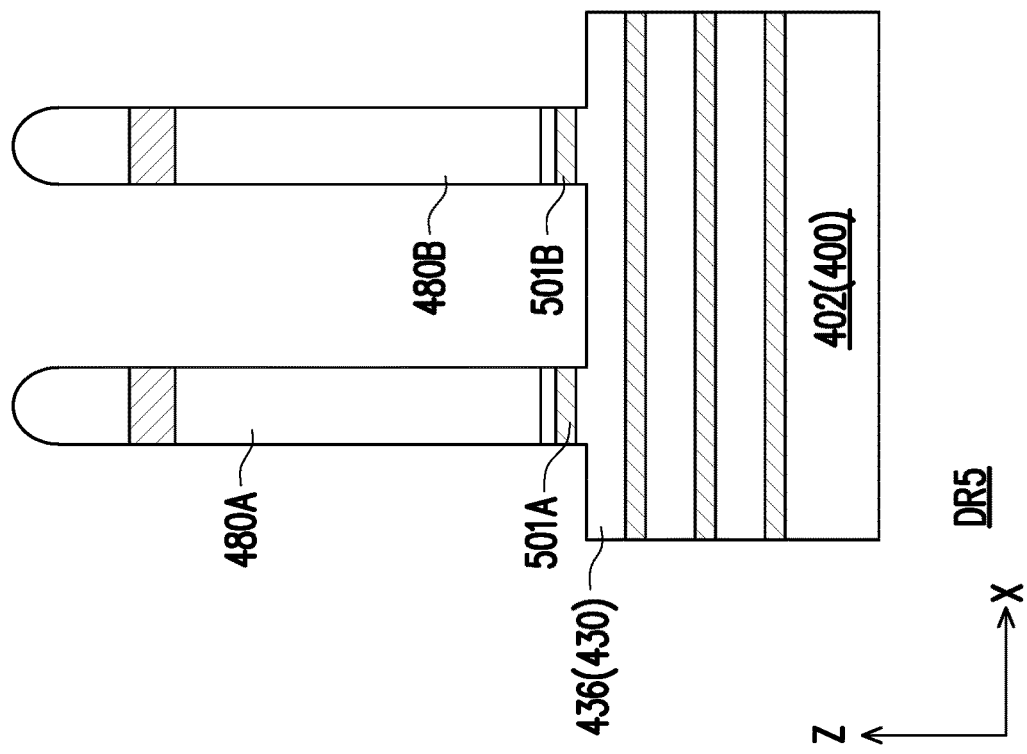

Referring to FIG. 23A and FIG. 23B, one or more dummy gate structures 480 and 490 are formed on the stacks 430 and 440 on the device regions DR5 and DR6, respectively. The dummy gate structures 480, 490 may have similar structure and be formed following similar processes as the ones previously described for the dummy gate structures 180, 190 (illustrated, e.g., in FIG. 9A and FIG. 9B). The dummy gate structures 480 may be used as masks during patterning of the uppermost strip of sacrificial material 437 to form the nanosheet of sacrificial material 501, which exposes the uppermost strip of channel material 436. Similarly, the dummy gate structures 490 may be used as masks during patterning of the uppermost strip of sacrificial material 449 to form the nanosheet of sacrificial material 511, which exposes the uppermost strip of channel material 448.

Referring to FIG. 23A, FIG. 23B, FIG. 24A, and FIG. 24B, gate spacers 520, 530 are formed at opposite sides of the dummy gate structures 480, 490, on top of the stacks of semiconductor strips 430 and 440. The gate spacers 520, 530 may include similar materials and be fabricated following similar processes as the ones previously described for the gate spacers 220, 230 (illustrated, e.g., in FIG. 10A and FIG. 10B). While the gate spacers 520, 530 are illustrated as bi-layered structures, the number of layers may vary according to design and production requirements. The dummy gate structures 480, 490 are used as masks during patterning of the stacks of semiconductor strips 430, 440 to form the stacks of semiconductor nanosheets 500 and 510, respectively. In each one of the stacks of nanosheets 500, 510, nanosheets of sacrificial material 501, 503, 505, 507, 511, 513, 515, 517, 519 are alternately stacked with nanosheets of channel material 502, 504, 506, 512, 514, 516, 518, over the strip bases 402, 404. In some embodiments, as one or more pairs of semiconductor strips (e.g., the strips 438, 439) were removed from the stack 430 before forming the semiconductor nanosheets 501-507, the topmost nanosheet of channel material 502 of the stack 500 is located at a lower level height along the Z direction than the topmost nanosheet of channel material 512 of the stack 510. For example, the lower surface (bottom surface) 512l of the topmost nanosheet of channel material 512 is located at a higher level height along the Z direction than the top surface 502t of the topmost nanosheet of channel material 502. Indeed, the topmost nanosheet of channel material 502 may be located at a same level height along the Z direction as (be substantially aligned with) the nanosheet of channel material 514, because both nanosheets of channel material 502 and 514 are formed from the same semiconductor layer of channel material 416 (illustrated, e.g., in FIG. 18). The same applies to the nanosheet of channel material 504 with respect to the nanosheet of channel material 516, and to the nanosheet of channel material 506 with respect to the nanosheet of channel material 518. That it, in these embodiments, the bottommost nanosheets of channel material 506 and 518 are substantially aligned along the Z direction.

Figures 24A, 24B:
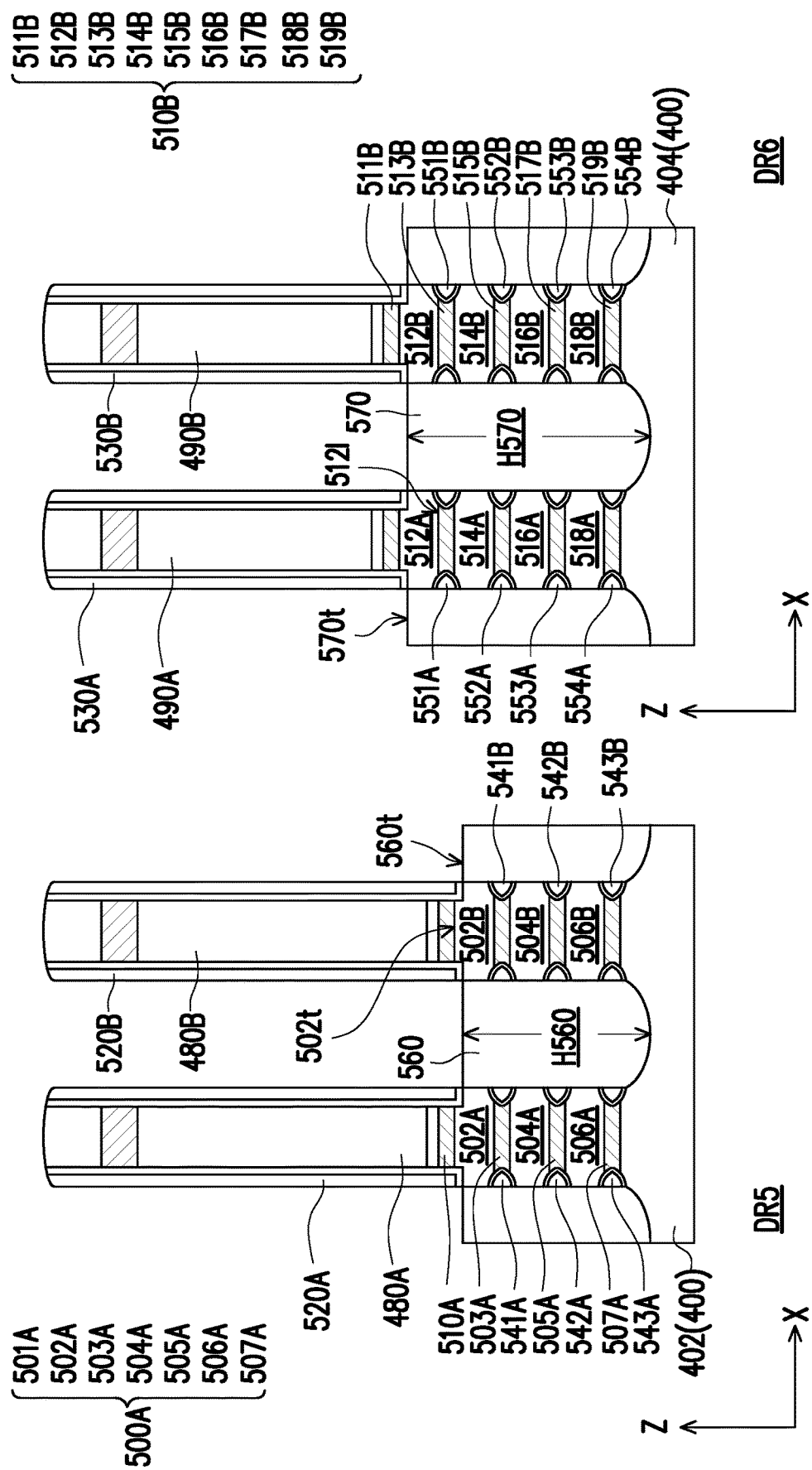

As illustrated in FIG. 24A and FIG. 24B, inner spacers 541-543 are formed at both extremities (along the X direction) of the nanosheets of sacrificial material 503, 505, and 507, and inner spacers 551-554 are formed at both extremities (along the X direction) of the nanosheets of sacrificial material 513, 515, 517, 519. Source and drain regions 560 are formed at opposite sides of the dummy gate structures 480, contacting both ends (along the X direction) of the nanosheets of channel material 502, 504, 506 and the strip base 402 on the device region DR5. Similarly, source and drain regions 570 are formed at opposite sides of the dummy gate structures 490, contacting both ends (along the X direction) of the nanosheets of channel material 512, 514, 516, 518 and the strip base 404 on the device region DR6. In some embodiments, a full height H560 along the Z direction of the source and drain regions 560 may be smaller than a full height H570 along the Z direction of the source and drain regions 570. The full heights H560 and H570 may be measured as the distance from the top surfaces 560t and 570t to the corresponding bottom points of the source and drain regions 560, 570 (the points of minimum thickness of the semiconductor substrate 400 underneath the source and drain regions 560, 570).

Figure 25A:
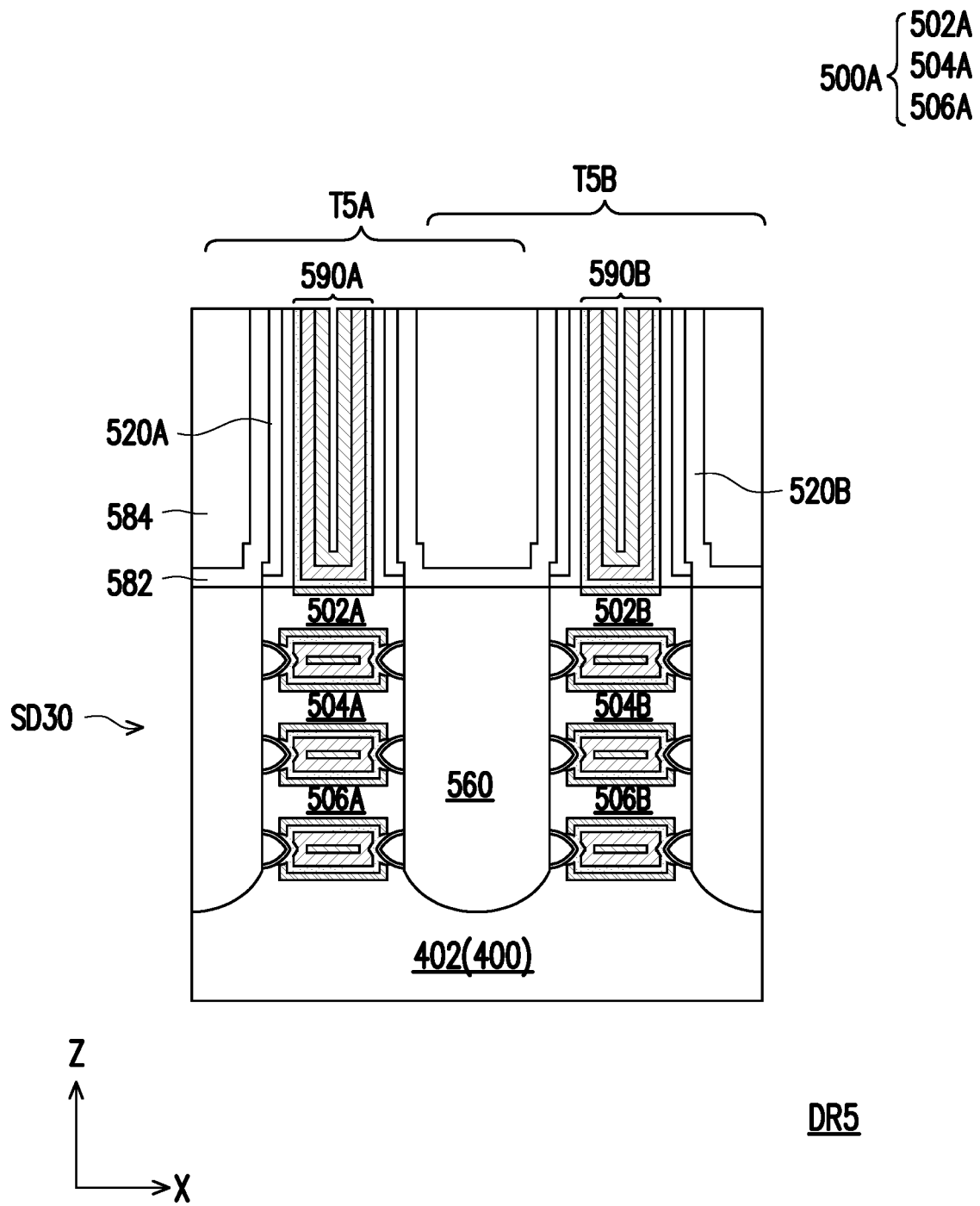
Figure 25B:
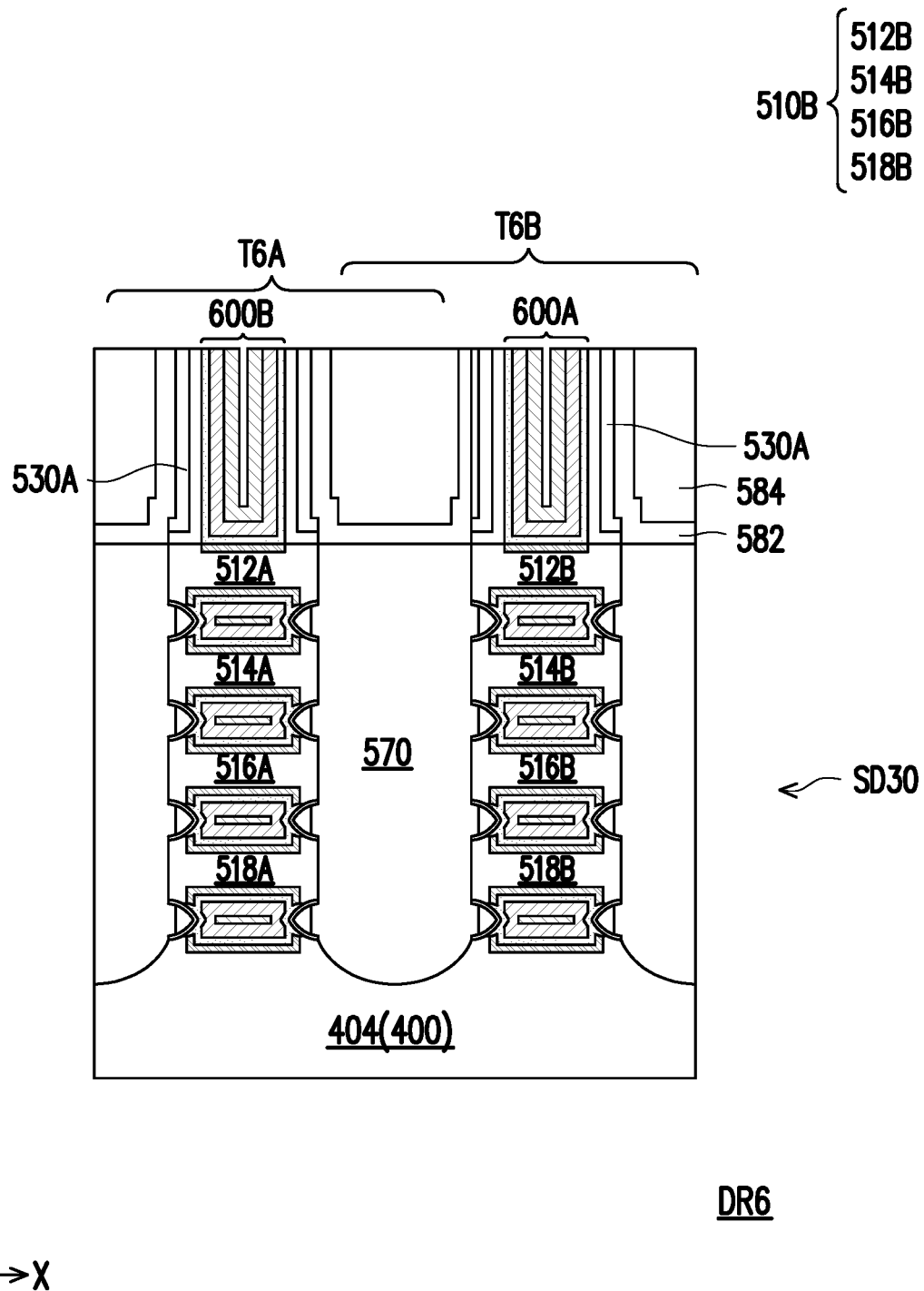

Thereafter, manufacturing of the semiconductor device SD30 illustrated in FIG. 25A and FIG. 25B may further include formation of the etch stop layer 582 and the interlayer dielectric layer 584 over the source and drain regions 560, 570 around the gate spacers 520, 530, removal of the nanosheets of sacrificial material 501, 503, 505, 507 from the stack 500 and the nanosheets of sacrificial material 511, 513, 515, 517, 519 from the stack 510, and replacement of the dummy gate structures 520, 530 with the gate structures 590, 600, following similar process steps as previously described with reference with FIG. 15A to FIG. 16B. In some embodiments, the transistors T5 on the device region DR5 of the semiconductor device SD30 include a different number of channels (the nanosheets of channel material 502, 504, 506) than the transistors T6 on the device region DR6. In some embodiments, each of the transistors T6 includes at least one more channel than the transistors T5. In some embodiments, by fabricating the transistors T5, T6 with a different number of semiconductor channels it is possible to fine-tune the electrical properties (e.g., balance the current between different device regions DR5, DR6) of the semiconductor device SD30 according to the requirements of the intended application. In some embodiments, source and drain dielectric layers (not shown) may be formed before forming the source and drain regions 560, 570, similar to what was previously described for the source and drain dielectric layers 350 and 360 illustrated in FIG. 17A and FIG. 17B.

Figure 26:
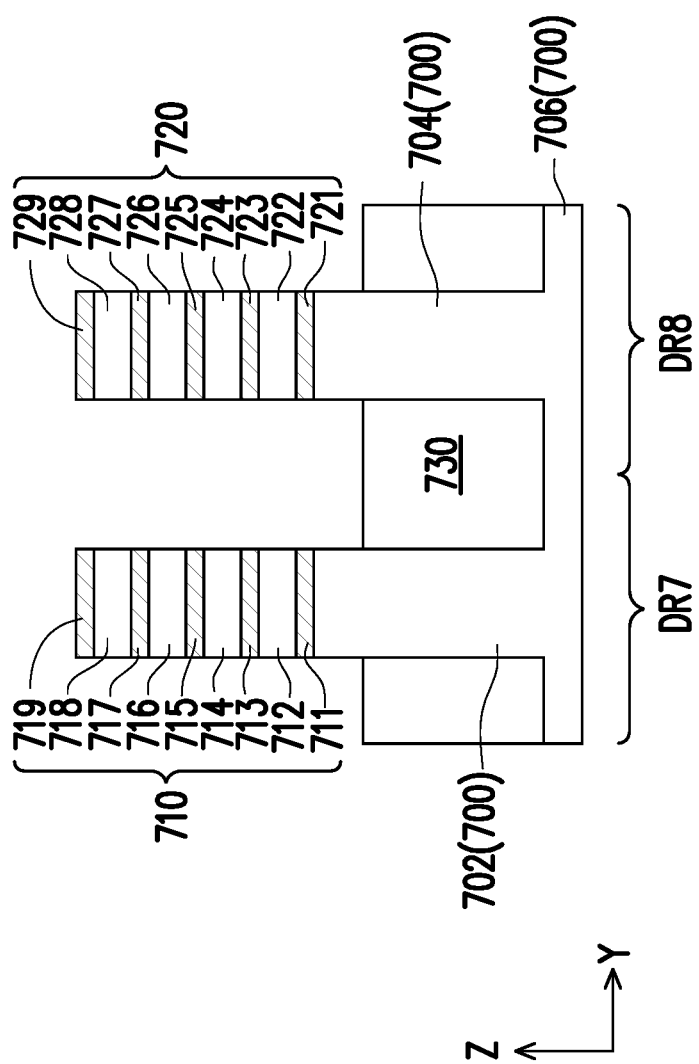
FIG. 26 is a schematic cross-sectional view of a structure produced during a manufacturing method of a semiconductor device according to some embodiments of the disclosure.

FIG. 26 to FIG. 30B are schematic cross-sectional views of structures produced during a manufacturing process of a semiconductor device SD40 according to some embodiments of the disclosure. The cross-sectional view of FIG. 26 is taken in a YZ plane corresponding to the YZ plane of the view FIG. 1. In some embodiments, the structure illustrated in FIG. 26 may be formed from a manufacturing intermediate similar to the one illustrated in FIG. 20. The manufacturing intermediate corresponding to the structure of FIG. 20 would include a semiconductor substrate 700 patterned to form strip bases 702 and 704 connected to a common semiconductor base 706, in which stacks of semiconductor strips 710 and 720 are respectively formed on the strip bases 702 and 704 by patterning a common stack of semiconductor layers (not shown) extending on the device regions DR7 and DR8. The structure illustrated in FIG. 26 may be obtained from such a manufacturing intermediate by removing the hard masks (e.g., similar to the hard masks 420 illustrated in FIG. 20) and recessing the insulating material (e.g., similar to the insulating material 450 illustrated in FIG. 20) to form the isolation structures 730 exposing the stacks of semiconductor strips 710, 720 and the upper portions of the strip bases 702, 704. In some embodiments, at the manufacturing stage illustrated in FIG. 26 the stack 710 located on the device region DR7 includes the same number of semiconductor strips (e.g., the semiconductor strips 711-719) as the stack 720 located on the device region DR8 (e.g., the semiconductor strips 721-729). Similar to the other stacks of the present disclosure, also the stacks 710 and 720 include strips of channel material 712, 714, 716, 718, 722, 724, 726, 728 alternately stacked with strips of sacrificial material 711, 713, 715, 717, 719, 721, 723, 725, 727, 729. Also, the strips of channel material 712, 714, 716, 718, 722, 724, 726, 728 may include the same material as the semiconductor substrate 700.

Figure 27B:
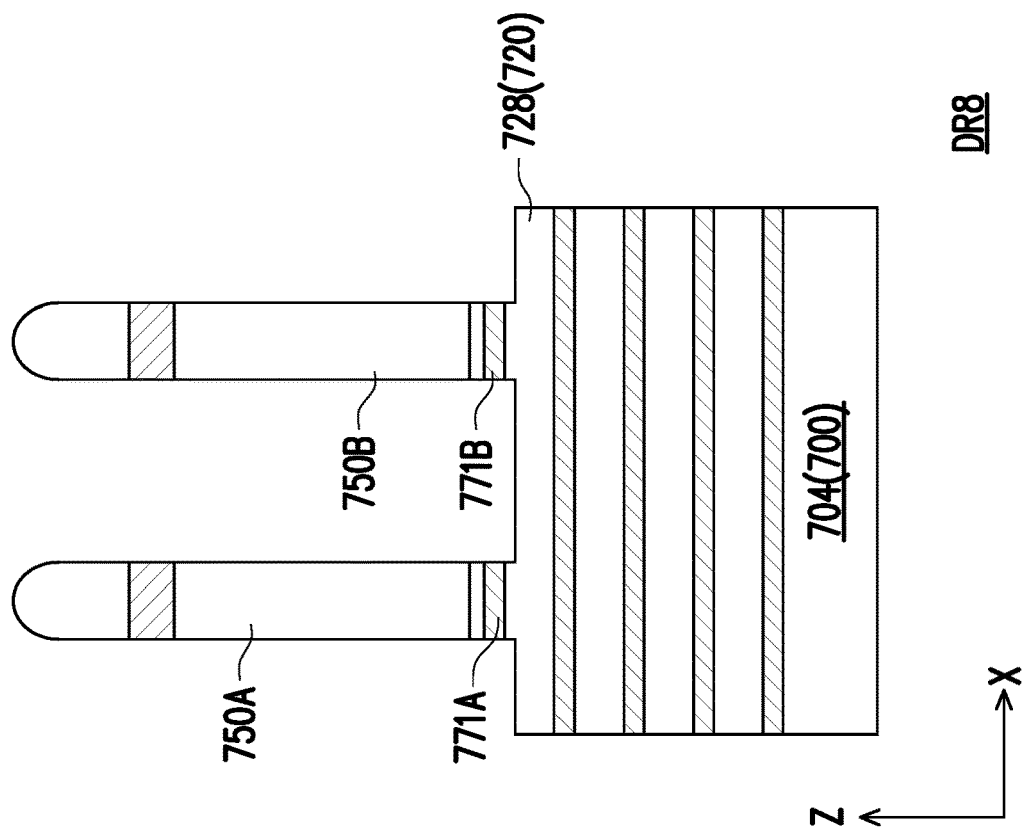
Figure 27A:
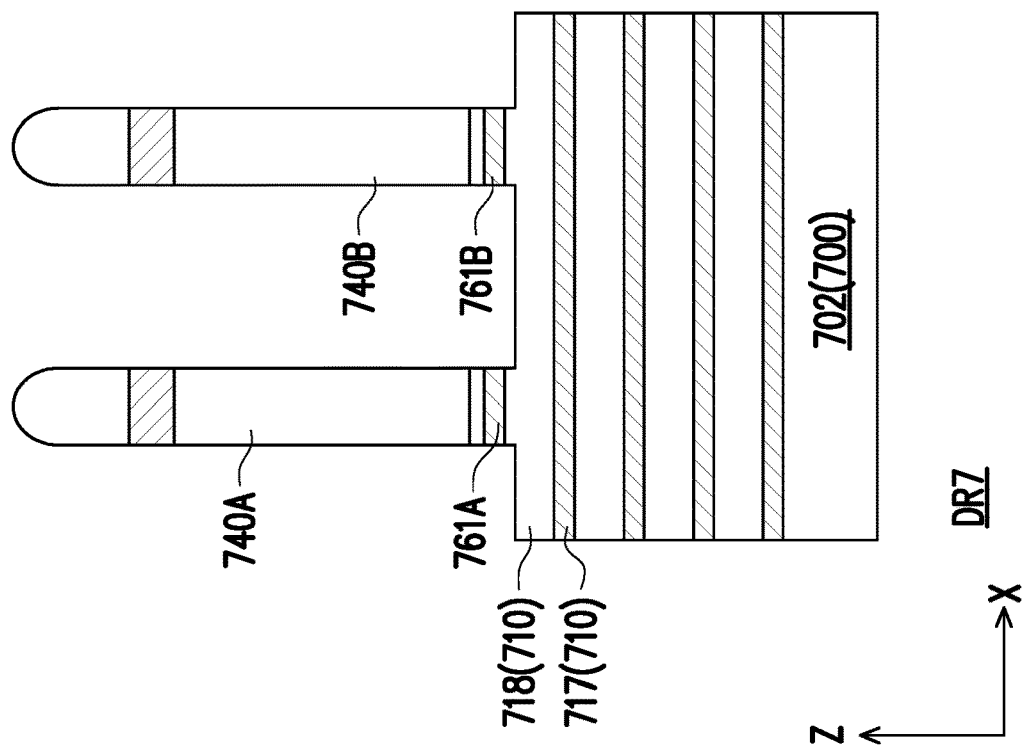
Figure 28B:
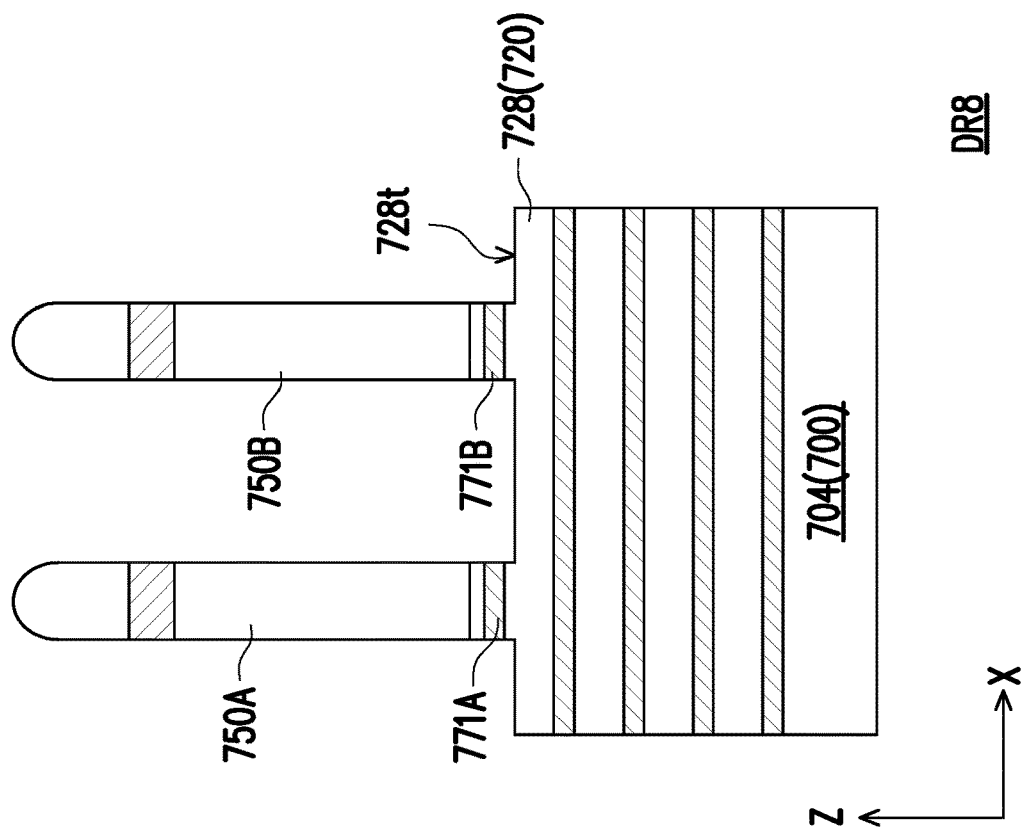
Figure 28A:
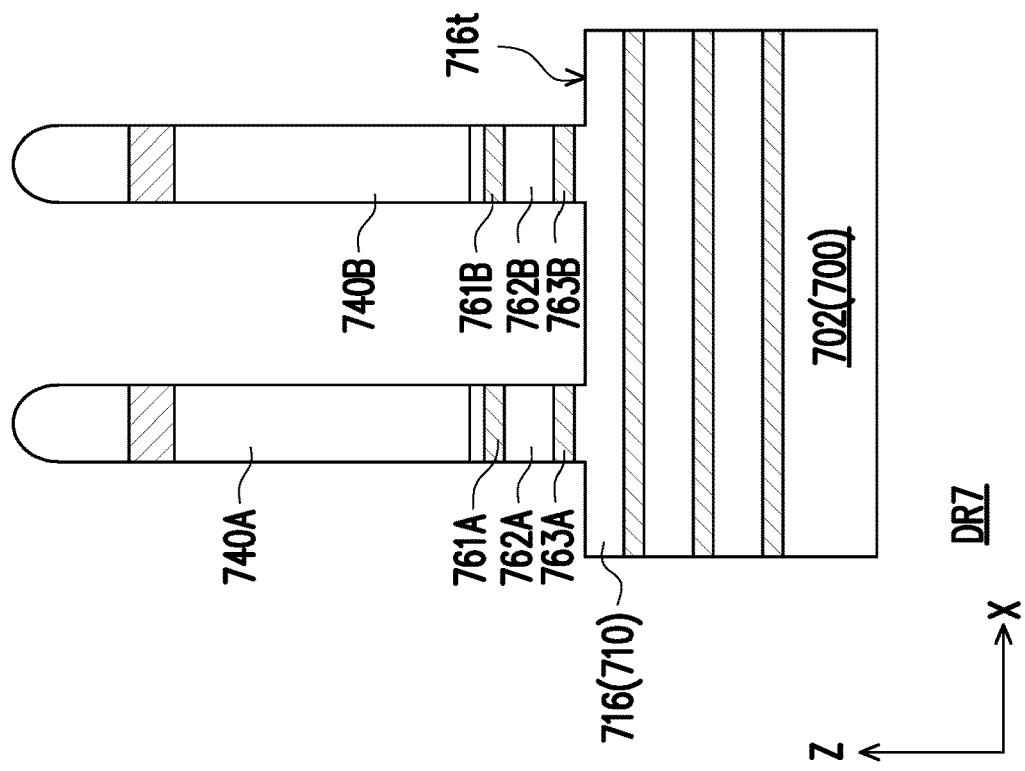

The cross-sectional views of FIG. 27A to FIG. 30A are taken in a XZ plane corresponding to the XZ plane of the view of FIG. 16A (cutting through the stack 710 on the device region DR7). The cross-sectional views of FIG. 27B to FIG. 30B are taken in a XZ plane corresponding to the XZ plane of the view of FIG. 16B (cutting through the stack 720 on the device region DR8). Referring to FIG. 27A and FIG. 27B, one or more dummy gate structures 740 and 750 are formed on the stacks 710 and 720 on the device regions DR7 and DR8, respectively. The dummy gate structures 740, 750 may have similar structures and be formed following similar processes as the ones previously described for the dummy gate structures 180, 190 (illustrated, e.g., in FIG. 9A and FIG. 9B). The dummy gate structures 740 may be used as masks during patterning of the uppermost strip of sacrificial material 719 to form the nanosheet of sacrificial material 761 exposing the uppermost strip of channel material 718, and the dummy gate structures 750 may be used as masks during patterning of the uppermost strip of sacrificial material 729 to form the nanosheet of sacrificial material 771 and expose the uppermost strip of channel material 728.

Referring to FIG. 27A, FIG. 27B, FIG. 28A, and FIG. 28B, a further patterning step may be performed on the uppermost strip of channel material 718 and the underlying strip of sacrificial material 717 on the device region DR7, to form the nanosheets 762 and 763, respectively, thus exposing the strip of channel material 716. In some embodiments, the semiconductor strips 717, 718 may be patterned via one or more etching steps. The dummy gate structures 740 may be used as masks during these patterning steps. During patterning of the strips 718, 717, an auxiliary mask (not shown) may be disposed on the stack of semiconductor strips 720 on the device region DR8. That is, the auxiliary mask may protect the strip of channel material 728 from the etchant or, more generally, from the agent(s) used to pattern the strips 717 and 718.

Referring to FIG. 28A, FIG. 28B, FIG. 29A, and FIG. 29B, gate spacers 780 are formed around the dummy gate structures 740 on the uppermost strip of channel material 716 and the isolation structures 730 (illustrated, e.g., in FIG. 26). The gate spacers 780 may extend along the side surfaces of the dummy gate structure 740, and further cover the extremities (along the X direction) of the nanosheets 761, 762, and 763, reaching the top surface 716t of the strip of channel material 716. Gate spacers 790 are formed around the dummy gate structures 750 on the uppermost strip of channel material 728 and the isolation structures 730 (illustrated, e.g., in FIG. 27). The gate spacers 790 may extend along the side surfaces of the dummy gate structure 750, and further cover the extremities (along the X direction), of the nanosheet of sacrificial material 771, reaching the top surface 728t of the strip of channel material 728. Each one of the gate spacers 780, 790 may include one or more layers 782, 784, 792, 794. Materials and processes to form the gate spacers 780, 790 may be similar to the ones previously described with reference to the gate spacers 220, 230 illustrated, e.g., in FIG. 10A and FIG. 10B.

Figures 29A, 29B:
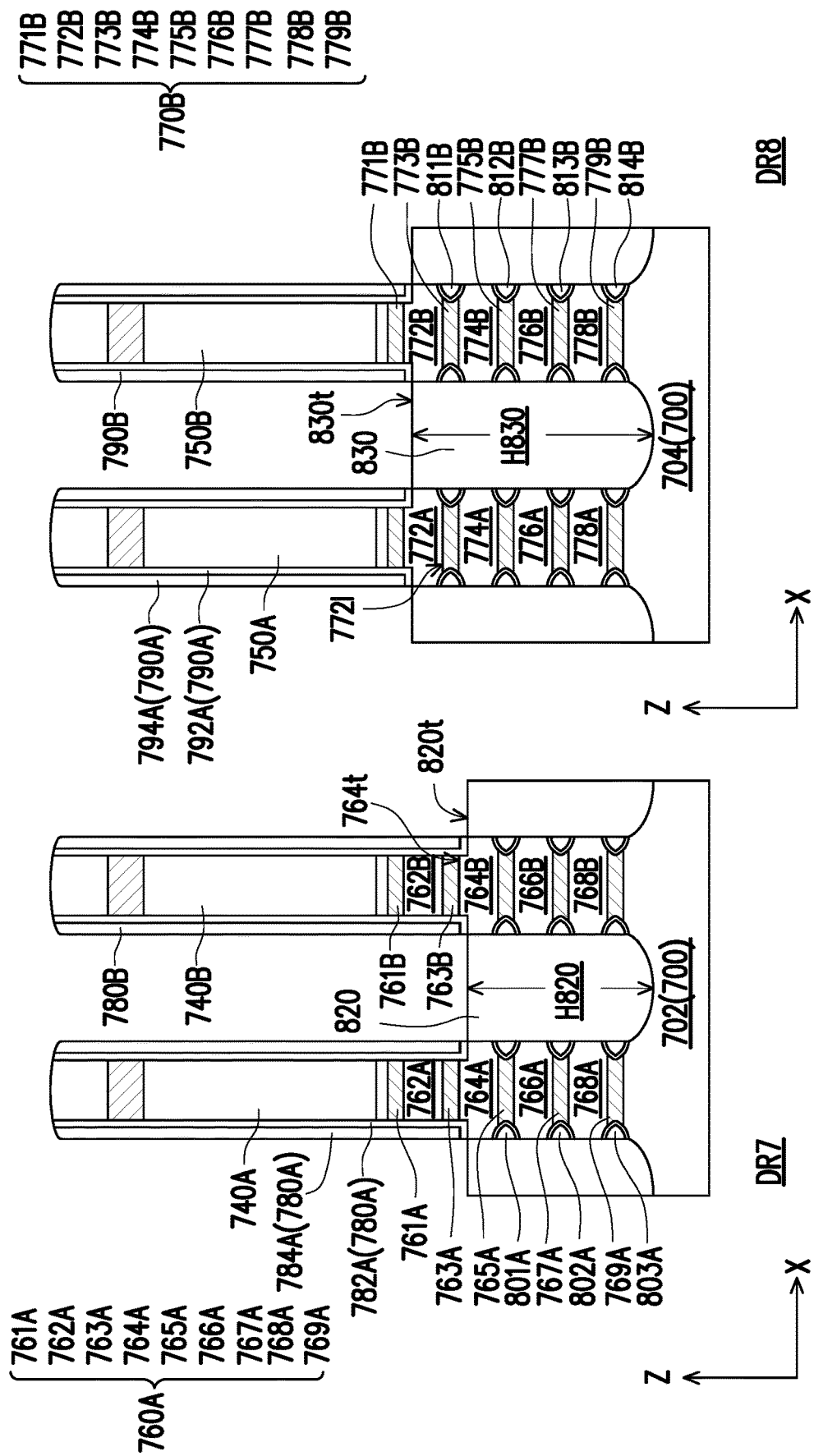

The subsequent steps of the manufacturing process may be substantially similar to the ones previously described with reference from FIG. 11A to FIG. 16B, and will be only briefly summarized in the following. Corresponding elements between the two embodiments may be fabricated employing similar materials and following similar processes. Referring to FIG. 29A, the dummy gate structures 740, 750 are used as hard masks during patterning of the stacks of semiconductor strips 710, 720 to form stacks of semiconductor nanosheets 760 and 770. Inner spacers 801-803 are formed at each extremity (along the X direction) of the nanosheets of channel material 765, 767, 769 of the stacks 760, respectively. Similarly, inner spacers 811-814 are formed at each extremity (along the X direction) of the nanosheets of channel material 773, 775, 777, 779 of the stacks 770, respectively. Thereafter, source and drain regions 820 are formed on the semiconductor substrate 700 at opposite sides of the dummy gate structures 740. Each one of the extremities along the X direction of the nanosheets of channel material 764, 766, 768 contacts a source and drain region 820 of a pair or source and drain regions 820 disposed at opposite sides of the overlying dummy gate structure 740. In some embodiments, the stack of semiconductor nanosheets 760 includes four nanosheets of channel material 762, 764, 766, 768. However, only some of said nanosheets (e.g., the three nanosheets 764, 766, 768 out of the four total) are in contact with the source and drain regions 820 and can function as channels for the corresponding transistor. The other nanosheet(s) of channel material (e.g., the nanosheet 762) which is covered by the gate spacers 780 and does not contact the source and drain regions 820, is referred to as a dummy channel, because it does not contribute to the charge transport in between the source and drain regions 820. While in the structure of FIG. 29A each stack 760 includes only one dummy channel 762, the disclosure is not limited thereto. In some alternative embodiments, more than one dummy channel may be included, according to the application requirements. On the other hand, on the device region DR8, all the nanosheets of channel material 772, 774, 776, 778 are in contact with the source and drain regions 830 at opposite sides of the dummy gate structures 750. That is, in the stacks of semiconductor nanosheets 770 on the device region DR8 there are no dummy channels—or, in any case, fewer dummy channels than in the stacks of semiconductor nanosheets 760 on the device region DR7. Therefore, in some embodiments, the topmost nanosheets of channel material which are capable of acting as active channels in the stacks 760 (e.g., the nanosheets 764) are located at a lower level height than the topmost nanosheets of channel material acting as active channels in the stacks 770 (e.g., the nanosheets 772). In some embodiments, the topmost nanosheets of channel material which can act as active channels in the stacks 760 (e.g., the nanosheets 764) are formed from a same semiconductor layer (not shown) as one of the lower nanosheets (e.g., the nanosheets 774) in the stacks 770 (e.g., nanosheets other than the topmost nanosheets 772). That is, the nanosheets 764 may be substantially aligned along the Z direction with the nanosheets 774, while the topmost nanosheets 772 of the stacks 770 may be substantially aligned along the Z direction with the dummy channels 762. In some embodiments, the upper surfaces 764t of the topmost nanosheets capable of acting as active channels in the stacks 760 (e.g., the nanosheets 764) are located at a lower level height along the Z direction than the bottom surfaces 772l of the topmost nanosheets 772 in the stacks 770. In some embodiments, a full height H820 along the Z direction of the source and drain region 820 may be smaller than a full height H830 along the Z direction of the source and drain region 830. The full heights H820 and H830 may be measured as the distance from the top surfaces 820t and 830t to the corresponding bottom points of the source and drain regions 820, 830 (the points of minimum thickness of the semiconductor substrate 700 below the source and drain regions 820, 830).

Figure 30A:
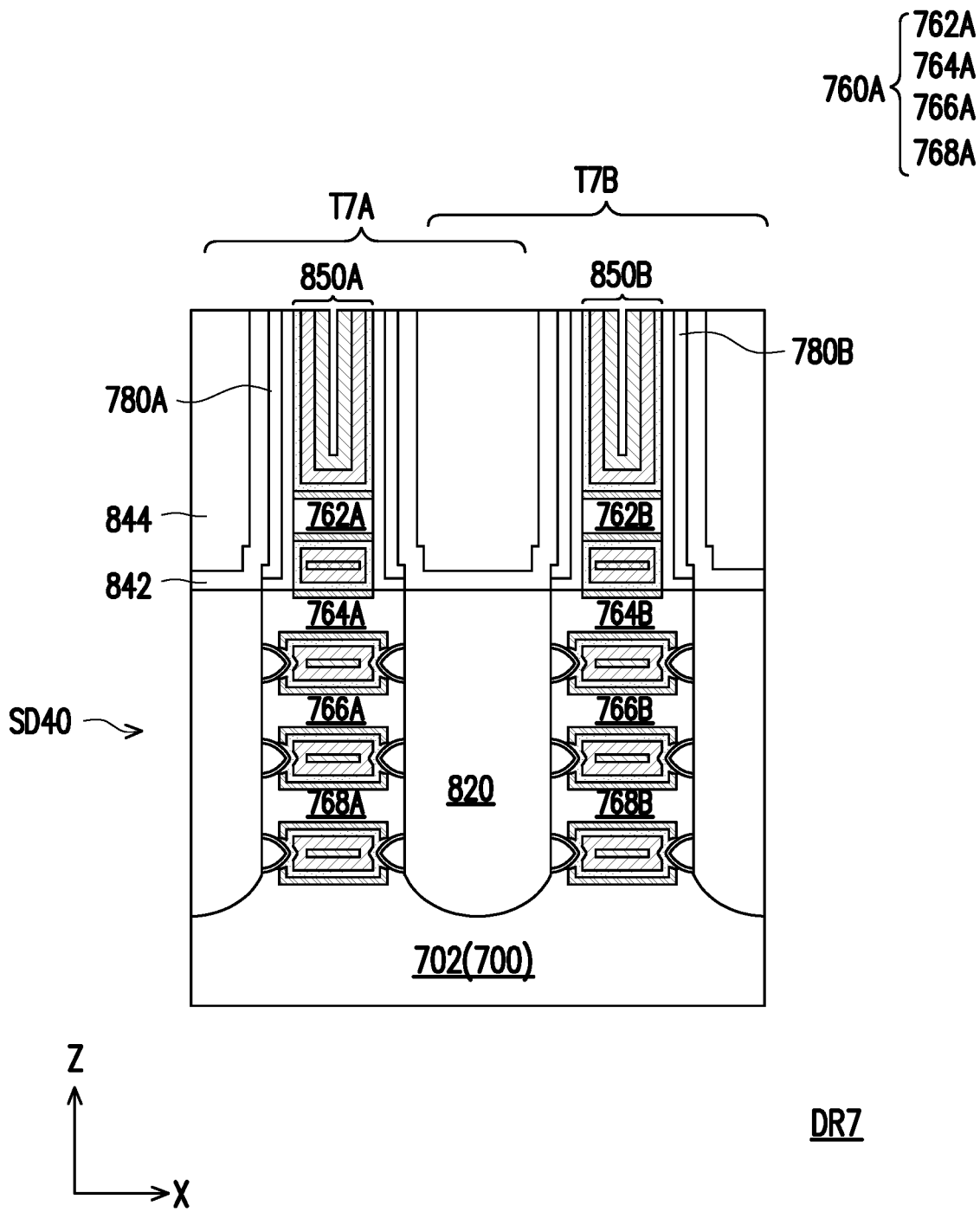
Figure 30B:
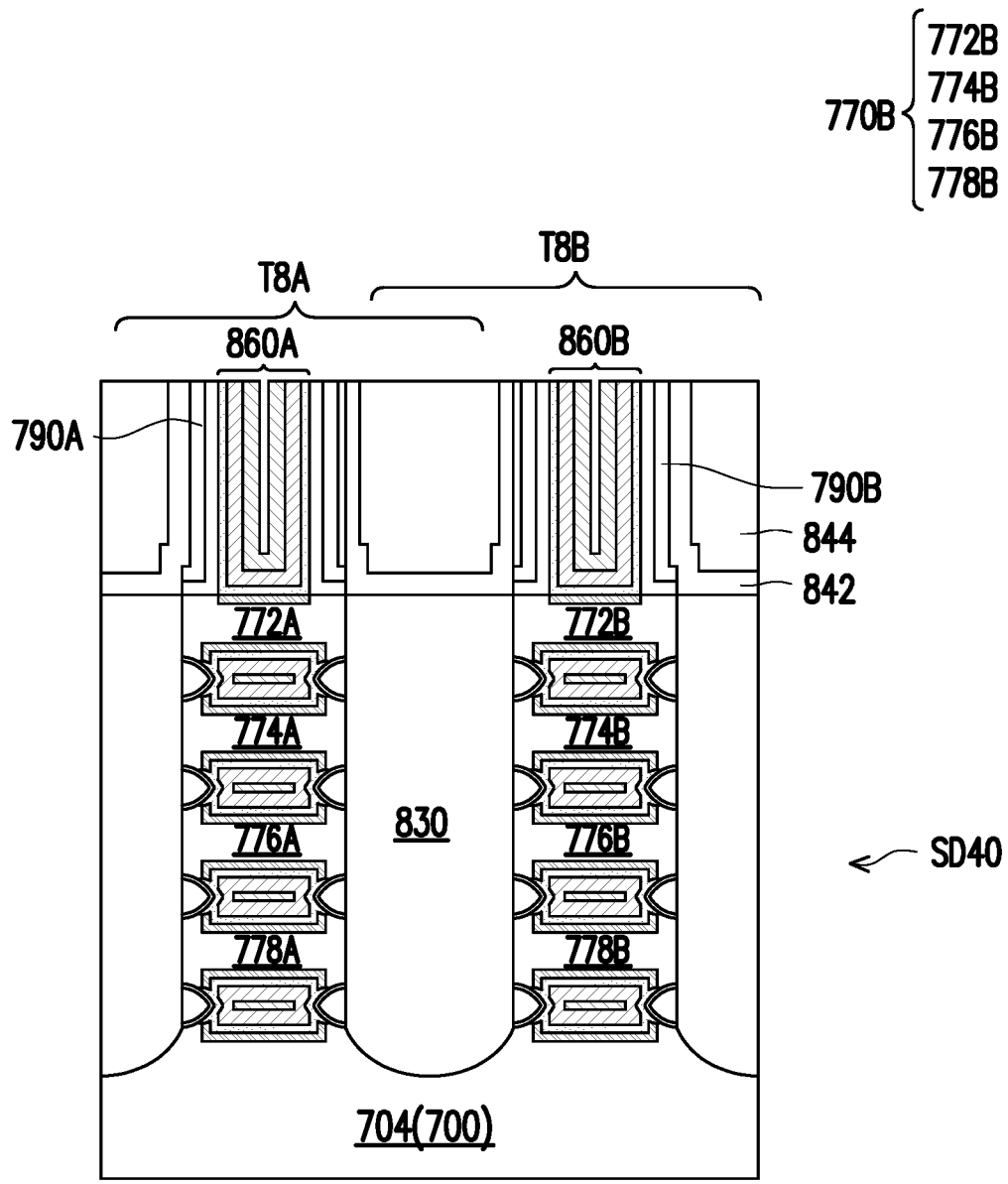

Thereafter, manufacturing of the semiconductor device SD40 illustrated in FIG. 30A and FIG. 30B may further include formation of the etch stop layer 842 and the interlayer dielectric layer 844 over the source and drain regions 820, 830 around the gate spacers 780 and 790, removal of the nanosheets of sacrificial material 761, 763, 765, 767 from the stack 760 and the nanosheets of sacrificial material 771, 773, 775, 777, 779 from the stack 770, and replacement of the dummy gate structures 740 and 750 with the gate structures 850 and 860, following similar process steps as previously described with reference with FIG. 13A to FIG. 16B. In some embodiments, the transistors T7 on the device region DR7 of the semiconductor device SD40 include a different number of active channels (e.g., the nanosheets of channel material 764, 766, 768) than the transistors T8 on the device region DR8. In some embodiments, the transistors T8 include at least one more active channel than the transistors T7. In some embodiments, by fabricating the transistors T7, T8 with a different number of semiconductor channels it is possible to fine-tune the electrical properties (e.g., balance the current between the device regions DR7, DR8) of the semiconductor device SD40 according to the requirements of the intended application. In some embodiments, source and drain dielectric layers (not shown) may be formed before forming the source and drain regions 560, 570, similar to what was previously described for the source and drain dielectric layers 350 and 360 illustrated in FIG. 17A and FIG. 17B.

According to some embodiments, a semiconductor device includes a semiconductor substrate, a first semiconductor stack, a second semiconductor stack, a first gate structure and a second gate structure. The semiconductor substrate comprising a first device region and a second device region. The first semiconductor stack is located on the semiconductor substrate over the first device region, and has first channels. The second semiconductor stack is located on the semiconductor substrate over the second device region, and has second channels. A total number of the first channels is greater than a total number of the second channels. The first gate structure encloses the first semiconductor stack. The second gate structure encloses the second semiconductor stack.

According to some embodiments, a semiconductor device includes a semiconductor substrate, a first transistor, and a second transistor. The first transistor is formed on the semiconductor substrate, and includes a first pair of source and drain regions, first semiconductor channels, and a first gate structure. The first semiconductor channels are vertically stacked over each other and extend from the source region to the drain region of the first pair. The first gate structure is stacked on and extends in between the first semiconductor channels. The second transistor is formed on the semiconductor substrate, and includes a second pair of source and drain regions, second semiconductor channels, and a second gate structure. The second semiconductor channels are vertically stacked over each other and extend from the source region to the drain region of the second pair. The second gate structure is stacked on and extends in between the second semiconductor channels. A total number of the first semiconductor channels is greater than a total number of the second semiconductor channels.

According to some embodiments, a method of manufacturing a semiconductor device includes the following steps. A semiconductor substrate is provided. The semiconductor substrate includes a first device region and a second device region. First stacked semiconductor strips are formed over the first device region. Second stacked semiconductor strips are formed over the second device region. Each of the first stacked semiconductor strips and the second stacked semiconductor strips includes strips of channel material and strips of sacrificial material alternately stacked. A first dummy gate structure is formed over the first stacked semiconductor strips on the first device region. A second dummy gate structure is formed over the second stacked semiconductor strips on the second device region. The first stacked semiconductor strips are patterned to form first stacked nanosheets. The second stacked semiconductor strips are patterned to form second stacked nanosheets. Source and drain regions are formed on opposite sides of each of the first dummy gate structure and the second dummy gate structure. The first dummy gate structure, the second dummy gate structure, and the portions of nanosheets of sacrificial material exposed after removal of the first dummy gate structure and the second dummy gate structure are removed via etching. A first gate structure is formed over the first device region encircling the nanosheets of channel material included in the first stacked nanosheets. A second gate structure is formed over the second device region encircling the nanosheets of channel material included in the second stacked nanosheets. A total number of the nanosheets of channel material of the first stacked nanosheets contacting the source and drain regions at the sides of the first gate structure is larger than a total number of the nanosheets of channel material of the second stacked nanosheets contacting the source and drain regions at the sides of the second gate structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a semiconductor substrate, comprising a first device region and a second device region;
   a first semiconductor stack, disposed on the semiconductor substrate over the first device region, wherein the first semiconductor stack has first channels;
   a second semiconductor stack, disposed on the semiconductor substrate over the second device region, wherein the second semiconductor stack has second channels, and a total number of the first channels is greater than a total number of the second channels, wherein the second semiconductor stack further comprises a dummy channel disposed on a topmost second channel included in the second semiconductor stack, and the dummy channel is substantially aligned with a topmost first channel included in the first semiconductor stack along a direction perpendicular to the stacking direction of the first semiconductor stack and the semiconductor substrate;
   a first gate structure, enclosing the first semiconductor stack; and
   a second gate structure, enclosing the second semiconductor stack.

2. The semiconductor device of claim 1, wherein along a stacking direction of the first semiconductor stack and the semiconductor substrate, a bottommost first channel included in the first semiconductor stack is substantially aligned with a bottommost second channel included in the second semiconductor stack.

3. The semiconductor device of claim 1, further comprising:
   first source and drain regions, disposed at opposite sides of the first gate structure and connected to the first channels of the first semiconductor stack; and
   second source and drain regions, disposed at opposite sides of the second gate structure and connected to the second channels of the second semiconductor stack,
   wherein the first source and drain regions are in contact with the semiconductor substrate, the second source and drain regions are in contact with the semiconductor substrate, and a full height of the first source and drain regions is greater than a full height of the second source and drain regions.

4. The semiconductor device of claim 3, further comprising:
   a first dielectric layer, disposed between the first source and drain regions and the semiconductor substrate; and
   a second dielectric layer, disposed between the second source and drain regions and the semiconductor substrate.

5. The semiconductor device of claim 3,
   wherein first top surfaces of the first source and drain regions are leveled with a surface of a topmost first channel of the first channels, first bottom surfaces of the first source and drain regions are in contact with a surface of the semiconductor substrate, and the first top surfaces of the first source and drain region are opposite to the first bottom surfaces of the first source and drain regions in a stacking direction of the first source and drain regions and the semiconductor substrate, and
   wherein second bottom surfaces of the second source and drain regions are in contact with a surface of the semiconductor substrate, and the second top surfaces of the second source and drain region are opposite to the second bottom surfaces of the second source and drain regions in a stacking direction of the second source and drain regions and the semiconductor substrate.

6. The semiconductor device of claim 1, wherein the first semiconductor stack includes at least one more channel than the second semiconductor stack.

7. The semiconductor device of claim 1, wherein a vertical thickness of each peripheral region of the first channels is greater than a vertical thickness of each central region of the first channels, respectively.

8. The semiconductor device of claim 1, wherein a vertical thickness of each peripheral region of the second channels is greater than a vertical thickness of each central region of the second channels, respectively.

9. The semiconductor device of claim 1, further comprising:
   first inner spacers, each pair of the first inner spacers being disposed between two any adjacent first channels of the first channels and at two opposite sidewalls of a respective portion of the first gate structure, wherein a vertical size of each pair of the first inner spacers is less than a vertical size of the respective portion of the first gate structure; and
   second inner spacers, each pair of the second inner spacers being disposed between two any adjacent second channels of the second channels and at two opposite sidewalls of a respective portion of the second gate structure, wherein a vertical size of each pair of the second inner spacers is less than a vertical size of the respective portion of the second gate structure.

10. A semiconductor device, comprising:
    a semiconductor substrate;
    a first transistor, disposed over the semiconductor substrate, comprising:
       a first pair of source and drain regions;
       first semiconductor channels, vertically stacked over each other and extending from the source region of the first pair to the drain region of the first pair, wherein topmost surfaces of the first source and drain regions are substantially coplanar to a topmost surface of a topmost layer of the first channels, and bottommost surfaces of the first source and drain regions are in contact with the semiconductor substrate; and a first gate structure, stacked on and extending in between the first semiconductor channels; and a second transistor, disposed over the semiconductor substrate, comprising:

a second pair of source and drain regions;

second semiconductor channels, vertically stacked over each other and extending from the source region of the second pair to the drain region of the second pair, wherein topmost surfaces of the second source and drain regions are substantially coplanar to a topmost surface of a topmost layer of the second channels, and bottommost surfaces of the second source and drain regions are in contact with the semiconductor substrate; and a second gate structure, stacked on and extending in between the second semiconductor channels, wherein a total number of the first semiconductor channels is greater than a total number of the second semiconductor channels.

11. The semiconductor device of claim 10, wherein the second transistor further comprises:

a dummy semiconductor channel, stacked over the second semiconductor channels; and gate spacers, laterally contacting the second gate structure and the dummy semiconductor channel.

12. The semiconductor device of claim 10, wherein a bottom surface of a topmost channel of the first semiconductor channels is at a level height over the semiconductor substrate higher than a level height of a top surface of a topmost channel of the second semiconductor channels, wherein the bottom surface is the surface of the topmost channel closest to the semiconductor substrate and the top surface is the surface of the topmost channel farthest away from the semiconductor substrate.

13. The semiconductor device of claim 10, wherein a vertical thickness of each peripheral region of the first semiconductor channels is greater than a vertical thickness of each central region of the first semiconductor channels, respectively, and wherein a vertical thickness of each peripheral region of the second semiconductor channels is greater than a vertical thickness of each central region of the second semiconductor channels, respectively.

14. The semiconductor device of claim 10, wherein the first transistor further comprises:

first inner spacers, each pair of the first inner spacers being disposed between two any adjacent first channels of the first channels and at two opposite sidewalls of a respective portion of the first gate structure, wherein a vertical size of each pair of the first inner spacers is less than a vertical size of the respective portion of the first gate structure, and wherein the second transistor further comprises:

second inner spacers, each pair of the second inner spacers being disposed between two any adjacent second channels of the second channels and at two opposite sidewalls of a respective portion of the second gate structure, wherein a vertical size of each pair of the second inner spacers is less than a vertical size of the respective portion of the second gate structure.

15. A semiconductor device, comprising:

a semiconductor substrate, comprising a first device region and a second device region;

a first semiconductor stack, disposed on the semiconductor substrate over the first device region, wherein the first semiconductor stack has first channels;

a second semiconductor stack, disposed on the semiconductor substrate over the second device region, wherein the second semiconductor stack has second channels, and a total number of the first channels is greater than a total number of the second channels;

a first gate structure, enclosing the first semiconductor stack;

a second gate structure, enclosing the second semiconductor stack;

first source and drain regions, disposed at opposite sides of the first gate structure and connected to the first channels of the first semiconductor stack, wherein sidewalls of the first channels are substantially aligned to each other in a stacking direction of the first channels, topmost surfaces of the first source and drain regions are substantially coplanar to a topmost surface of a topmost layer of the first channels, and bottommost surfaces of the first source and drain regions are in contact with the semiconductor substrate, wherein the topmost layer of the first channels is away from the semiconductor substrate; and second source and drain regions, disposed at opposite sides of the second gate structure and connected to the second channels of the second semiconductor stack, wherein sidewalls of the second channels are substantially aligned to each other in a stacking direction of the second channels, topmost surfaces of the second source and drain regions are substantially coplanar to a topmost surface of a topmost layer of the second channels, and bottommost surfaces of the second source and drain regions are in contact with the semiconductor substrate, wherein the topmost layer of the second channels is away from the semiconductor substrate.

16. The semiconductor device of claim 15, wherein the second transistor further comprises:

a dummy semiconductor channel, stacked over the second semiconductor channels, wherein the dummy semiconductor channel is free from the second source and drain regions; and gate spacers, laterally contacting the second gate structure and the dummy semiconductor channel.

17. The semiconductor device of claim 16, wherein a portion of the second gate structure interposed between the dummy semiconductor channel and the topmost layer of the second channels is free from the second source and drain regions.

18. The semiconductor device of claim 15, wherein a vertical thickness of each peripheral region of the first semiconductor channels is greater than a vertical thickness of each central region of the first semiconductor channels, respectively, and wherein a vertical thickness of each peripheral region of the second semiconductor channels is greater than a vertical thickness of each central region of the second semiconductor channels, respectively.

19. The semiconductor device of claim 15, wherein the first transistor further comprises:

first inner spacers, each pair of the first inner spacers being disposed between two any adjacent first channels of the first channels and at two opposite sidewalls of a respective portion of the first gate structure, wherein a vertical size of each pair of the first inner spacers is less than a vertical size of the respective portion of the first gate structure, and wherein the second transistor further comprises:
second inner spacers, each pair of the second inner spacers being disposed between two any adjacent second channels of the second channels and at two opposite sidewalls of a respective portion of the second gate structure, wherein a vertical size of each pair of the second inner spacers is less than a vertical size of the respective portion of the second gate structure.

20. The semiconductor device of claim 1,
wherein a portion of the first gate structure laterally covered by the first source and drain regions has a lateral size less than a lateral size of an underlying first channel included in the first semiconductor stack and a lateral size of an overlying first channel included in the first semiconductor stack, wherein a portion of the second gate structure laterally covered by the second source and drain regions has a lateral size less than a lateral size of an underlying second channel included in the second semiconductor stack and a lateral size of an overlying second channel included in the second semiconductor stack.

* * * * *